United States Patent
Lee et al.

(10) Patent No.: US 10,008,505 B2
(45) Date of Patent: Jun. 26, 2018

(54) SEMICONDUCTOR DEVICE INCLUDING CAPACITOR AND METHOD OF MANUFACTURING THE SAME

(71) Applicant: Samsung Electronics Co., Ltd., Suwon-si (KR)

(72) Inventors: Jun-Noh Lee, Hwaseong-si (KR); Youngkuk Kim, Seoul (KR); Sangyeol Kang, Suwon-si (KR); Joonsoo Park, Seongnam-si (KR); KiVin Im, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 9 days.

(21) Appl. No.: 15/198,035

(22) Filed: Jun. 30, 2016

(65) Prior Publication Data
US 2017/0018553 A1    Jan. 19, 2017

(30) Foreign Application Priority Data

Jul. 14, 2015  (KR) .......................... 10-2015-0099875

(51) Int. Cl.
*H01L 27/108*    (2006.01)

(52) U.S. Cl.
CPC .. *H01L 27/10855* (2013.01); *H01L 27/10888* (2013.01); *H01L 27/10814* (2013.01); *H01L 27/10823* (2013.01)

(58) Field of Classification Search
None
See application file for complete search history.

(56) References Cited

U.S. PATENT DOCUMENTS

| 6,607,983 B1 * | 8/2003 | Chun ................ H01L 21/02063 257/E21.019 |
| 7,183,603 B2 * | 2/2007 | Park .................... H01L 27/0207 257/296 |
| 8,148,260 B2 * | 4/2012 | Shin .................. H01L 21/76804 257/E21.658 |
| 9,263,536 B2 * | 2/2016 | Kim .................... H01L 29/4236 |
| 2004/0147114 A1 * | 7/2004 | Park .................. H01L 21/76897 438/666 |

(Continued)

FOREIGN PATENT DOCUMENTS

| JP | 2004-103622 A | 4/2004 |
| KR | 10-2005-0002984 A | 1/2005 |

(Continued)

*Primary Examiner* — Andres Munoz
(74) *Attorney, Agent, or Firm* — Muir Patent Law, PLLC

(57) ABSTRACT

A method for manufacturing a semiconductor device may include forming contact pads spaced apart from each other in a first direction on a substrate and between first insulating patterns; forming first holes between the first insulating patterns and having bottom ends adjacent top surfaces of the contact pads; forming second holes between second insulating patterns and overlapping with partial portions of the first holes in a second direction perpendicular to the first direction; and forming a bottom electrode layer including first portions to cover the bottom ends of the first holes and sidewalls of the second holes. In forming the first and second holes, the first and second holes are formed simultaneously.

20 Claims, 55 Drawing Sheets

(56) References Cited

U.S. PATENT DOCUMENTS

| | | |
|---|---|---|
| 2006/0205143 A1 | 9/2006 | Govindarajan |
| 2007/0077702 A1 | 4/2007 | Cheng et al. |
| 2011/0183512 A1* | 7/2011 | Cho ................ H01L 21/76831 438/627 |
| 2012/0146237 A1* | 6/2012 | Yun ................ H01L 27/10817 257/774 |
| 2012/0214304 A1* | 8/2012 | Kim ................ H01L 27/10855 438/675 |
| 2014/0112050 A1 | 4/2014 | Park |
| 2014/0299926 A1 | 10/2014 | Kuroki |
| 2014/0299989 A1 | 10/2014 | Lim et al. |
| 2014/0367825 A1 | 12/2014 | Kim et al. |
| 2015/0061134 A1 | 3/2015 | Lee et al. |

FOREIGN PATENT DOCUMENTS

| | | |
|---|---|---|
| KR | 10-2012-0071049 A | 7/2012 |
| KR | 10-2012-0127026 A | 11/2012 |
| KR | 10-2013-0011320 A | 1/2013 |
| KR | 10-2014-0086647 A | 7/2014 |

\* cited by examiner

SEMICONDUCTOR DEVICE INCLUDING CAPACITOR AND METHOD OF MANUFACTURING THE SAME

CROSS-REFERENCE TO RELATED APPLICATIONS

This U.S. non-provisional patent application claims priority under 35 U.S.C. § 119 to Korean Patent Application No. 10-2015-0099875, filed on Jul. 14, 2015, in the Korean Intellectual Property Office, the entire contents of which are hereby incorporated by reference.

BACKGROUND OF THE INVENTION

Example embodiments of the present disclosure relate to a semiconductor device, and in particular, to a semiconductor device including a capacitor.

Due to their small-sized, multifunctional, and/or low-cost characteristics, semiconductor devices are widely used as important elements in the electronic industry. However, with an advance in an electronic industry, semiconductor devices are becoming more and more highly integrated, and thus, many technical issues arise. For example, as an integration density of the semiconductor device increases, it is important for patterns thereof to have a decreasing line width and/or space and an increasing height and/or aspect ratio. However, this may lead to an increased difficulty in a layer deposition process, poor uniformity in an etching process, and deterioration in reliability of the semiconductor device.

SUMMARY

Example embodiments of the present disclosure provide a semiconductor device with improved reliability and increased integration density.

According to example embodiments, a semiconductor device may include first insulating patterns on a substrate to extend in a first direction and parallel to each other, second insulating patterns between the first insulating patterns to define first holes, in conjunction with the first insulating patterns, contact pads filling lower regions of the first holes and having top surfaces lower than those of the first and second insulating patterns, third insulating patterns including second holes, which are respectively connected to the first holes, and whose centers are laterally shifted from centers of the first holes, respectively, and capacitors having bottom electrodes connected to the contact pads, respectively. The bottom electrode may include an upper portion upwardly extending along an inner sidewall of the second hole of the third insulating pattern and a lower portion conformally covering an upper inner surface of the first hole.

In some embodiments, the lower portion of the bottom electrode may include a first horizontal portion in contact with the contact pad, a second horizontal portion in contact with a bottom surface of the third insulating pattern, a third horizontal portion in contact with top surfaces of the first and second insulating patterns, and a vertical portion in contact with a sidewall of the second hole, the vertical portion connecting the first horizontal portion to the second and third horizontal portions.

In some embodiments, the upper portion of the bottom electrode may be extended in a vertical direction from the second and third horizontal portions.

In some embodiments, the first insulating patterns may have top surfaces positioned at substantially the same level as those of the second insulating patterns.

In some embodiments, a lower portion of each of the contact pads may have a width smaller than an upper portion thereof, when viewed in a vertical sectional view.

In some embodiments, the semiconductor device may further include bit lines, which are on the substrate and extend in substantially the same direction as the first insulating patterns and parallel to each other. Each of the first insulating patterns may be on a corresponding one of the bit lines.

In some embodiments, the semiconductor device may further include a plurality of transistors including first and second impurity regions formed in the substrate surface, and first contact plugs connecting the first impurity regions to the contact pads, respectively.

In some embodiments, the semiconductor device may further include bit lines on the substrate to extend in the first direction and parallel to each other, and second contact plugs electrically and respectively connecting the bit lines to the second impurity regions. The first contact plugs may be between the bit lines, and the first contact plugs may be electrically separated from the bit lines by insulating spacers.

In some embodiments, the insulating spacers may have top surfaces positioned at a lower level than those of the first and second insulating patterns.

In some embodiments, a lower region of the first hole may have a width smaller than an upper region thereof.

In some embodiments, the capacitor may further include a dielectric layer conformally covering inner and outer side surfaces of the bottom electrode, and a top electrode on the dielectric layer to face the inner and outer side surfaces of the bottom electrode.

According to other example embodiments of the inventive concept, a semiconductor device may include transistors on a substrate, each of the transistors including first and second impurity regions, bit lines electrically connected to the first impurity regions to extend in a direction, first insulating patterns on the bit lines, respectively, to extend in the direction, second insulating patterns between the first insulating patterns to define first holes in conjunction with the first insulating patterns, first contact plugs filling lower regions of the first holes, the first contact plugs being electrically and respectively connected to the second impurity regions, contact pads on the first contact plugs, respectively, to partially fill the first holes and have top surfaces lower than those of the first and second insulating patterns, a third insulating pattern on the first and second insulating patterns, the third insulating pattern having second holes, whose centers are laterally shifted from centers of the first holes, and capacitors on the contact pads, respectively. Each of the capacitors may include a bottom electrode, a dielectric layer on the bottom electrode, and a top electrode on the dielectric layer. The bottom electrode may have a cylindrical structure with a closed bottom surface and may include a lower portion, which is conformally formed on inner sidewalls of the first and second holes, and an upper portion upwardly extending from the lower portion.

In some embodiments, the semiconductor device may further include second contact plugs electrically connecting the first impurity regions to the bit lines.

In some embodiments, top surfaces of the first and second insulating patterns may be substantially coplanar with each other.

In some embodiments, the semiconductor device may further include contact spacers, which are respectively interposed between the bit lines and the first contact plugs. Each of the contact spacers may have a top surface lower than top surfaces of the first and second insulating patterns.

According to example embodiments, a method for manufacturing a semiconductor device may include providing a substrate, forming first insulating patterns on the substrate; forming first holes above the substrate, the first holes spaced apart from each other in a first direction, the first holes disposed between the first insulating patterns; forming contact pads between the first insulating patterns and filling first portions of the first holes; forming first sacrificial patterns on the contact pads to fill second portions of the first holes above the first portions of the first holes, the first sacrificial patterns contacting the contact pads; forming second insulating patterns on the first insulating patterns, forming second holes between the second insulating patterns to partially expose the respective first sacrificial patterns; removing the first sacrificial patterns to connect the first holes and the second holes; and forming a bottom electrode layer having a first portion contacting top surfaces of the contact pads and contacting sidewalls of the second portions of the first holes.

According to example embodiments, a method for manufacturing a semiconductor device may include forming first holes on a substrate between first insulating patterns spaced apart from each other in a first direction, each of the first holes including first to third regions from a bottom to a top of the respective first holes, forming first contact plugs filling the first regions of the first holes and lower portions of the second regions of the first holes; forming second contact plugs on the first contact plugs and filling upper portions of the second regions of the first holes and lower portions of the third regions of the first holes; forming first sacrificial patterns on the second contact plugs and filling upper portions of the third regions of the first holes; forming second holes to partially expose the respective first sacrificial patterns; removing the first sacrificial patterns to connect the third regions of the first holes with the second holes; and forming a bottom electrode layer connected to the respective contact pads. For each of the first holes, a first width of the first region in the first direction is greater than a second width of the second region in the first direction, and a third width of the third region in the first direction is greater than the second width of the second region.

According to example embodiments, a method for manufacturing a semiconductor device may include forming contact pads spaced apart from each other in a first direction on a substrate and between first insulating patterns; forming first holes between the first insulating patterns and having bottom ends adjacent top surfaces of the contact pads; forming second holes between second insulating patterns and overlapping with partial portions of the first holes in a second direction perpendicular to the first direction; and forming a bottom electrode layer including first portions to cover the bottom ends of the first holes and sidewalls of the second holes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 2A through 19A are plan views illustrating a method of fabricating a semiconductor device, according to example embodiments of the inventive concept.

FIGS. 2B through 19B are sectional views taken along line I-I' of FIGS. 2A through 19A according to example embodiments.

FIGS. 2C through 6C are sectional views taken along line II-II' of FIGS. 2A through 6A according to example embodiments.

FIGS. 7C through 19C are sectional views taken along line III-III' of FIGS. 7A through 19A according to example embodiments.

Figure 1A:
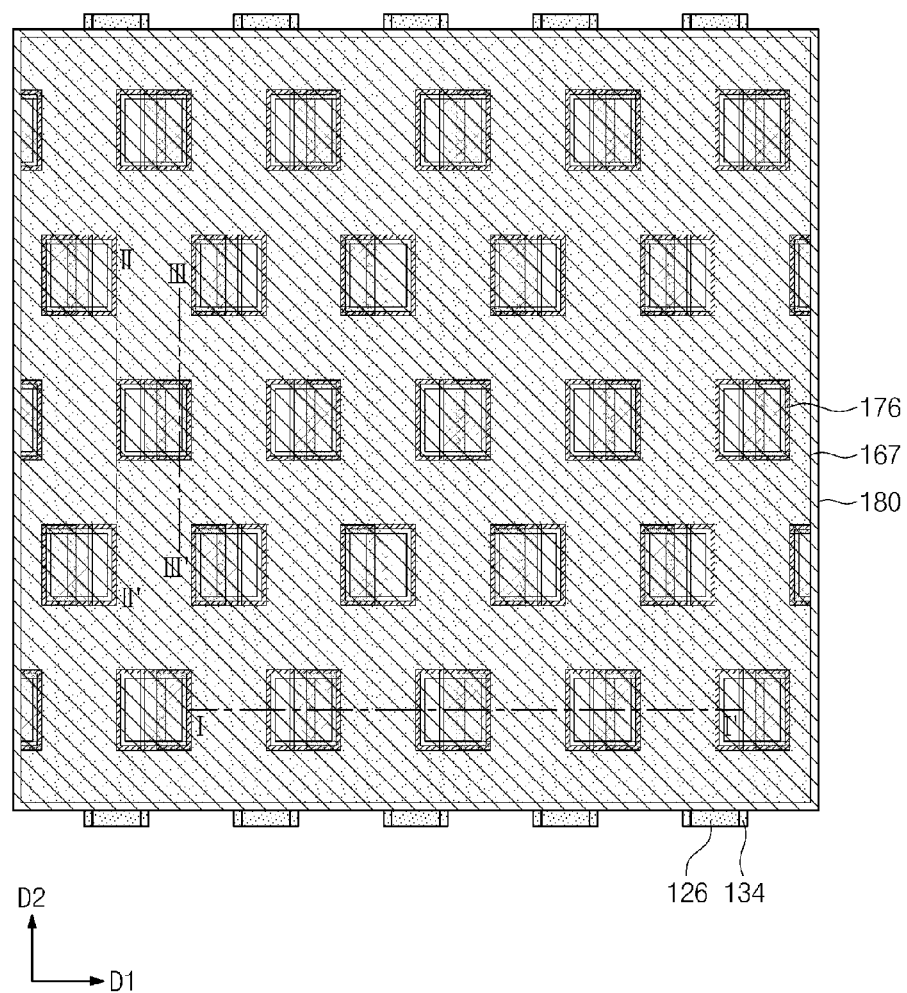
FIG. 1A is a plan view illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the present disclosure will now be described more fully with reference to the accompanying drawings, in which example embodiments are shown. Example embodiments of the present disclosure may, however, be embodied in many different forms and should not be construed as being limited to the embodiments set forth herein. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" or "in contact with" another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. Unless indicated otherwise, these terms are only used to distinguish one element, component, region, layer or section from another. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless the context indicates otherwise, terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
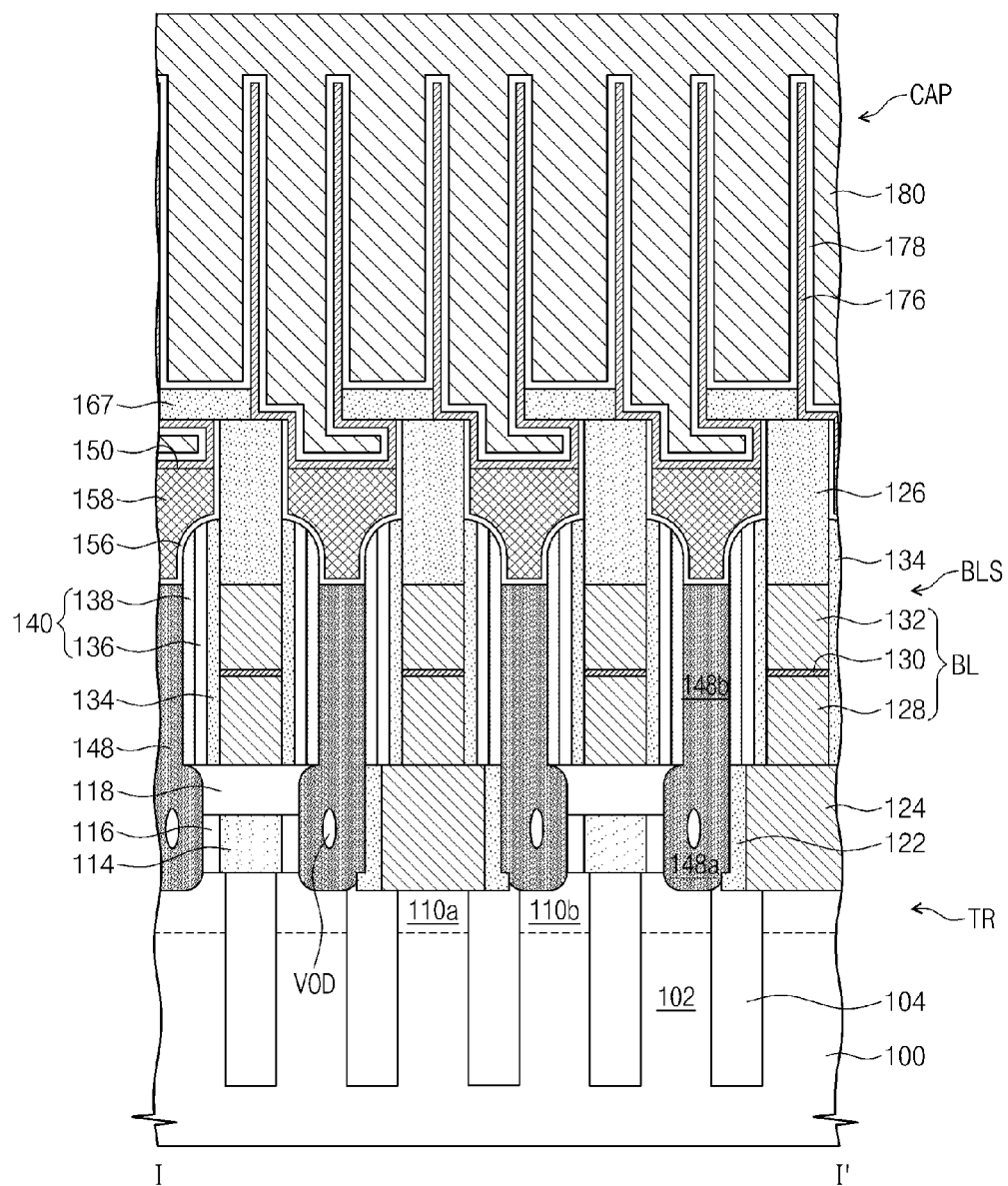
FIG. 1B is a sectional view, taken along line I-I', of the semiconductor device of FIG. 1A according to example embodiments.
Figure 1C:
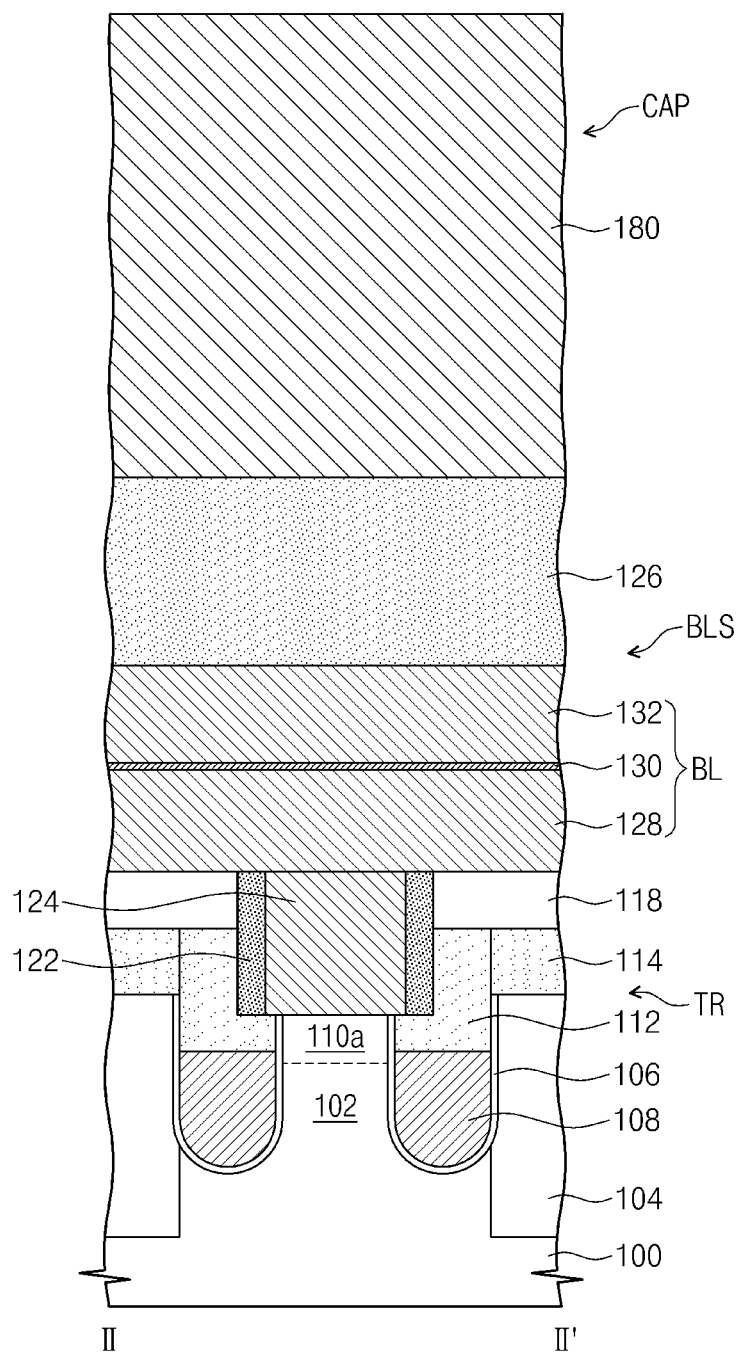
FIG. 1C is a sectional view, taken along line II-II', of the semiconductor device of FIG. 1A according to example embodiments.
Figure 1D:
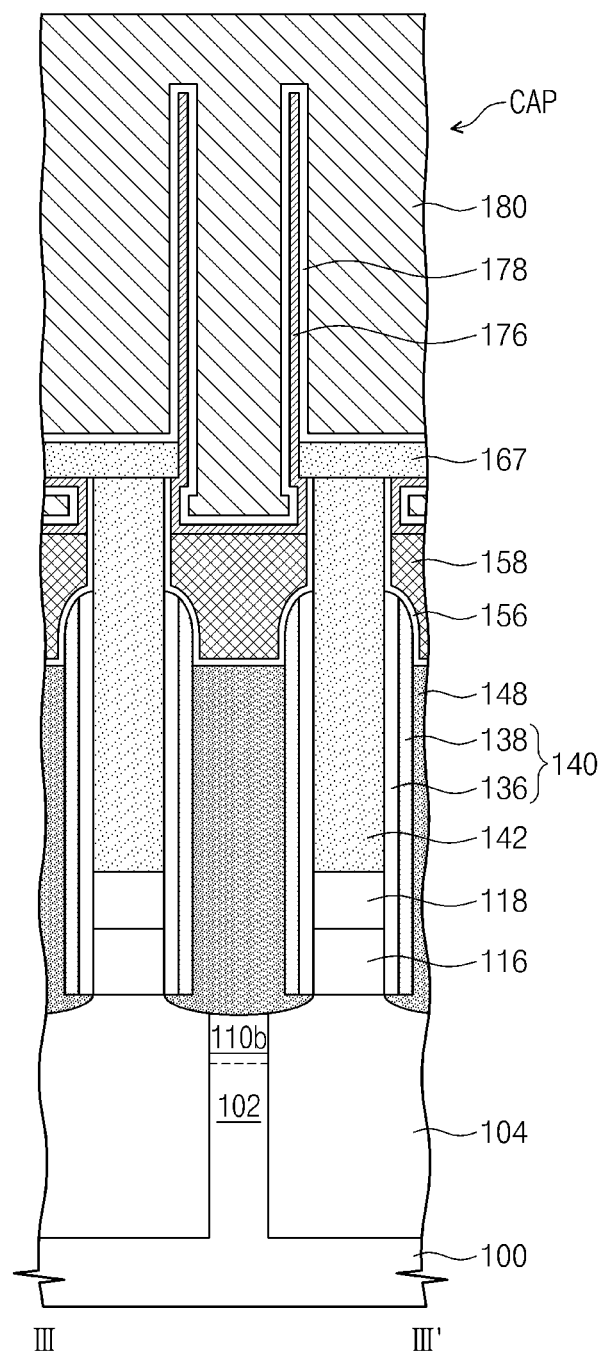
FIG. 1D is a sectional view, taken along line III-III', of the semiconductor device of FIG. 1A according to example embodiments.
Figure 1E:
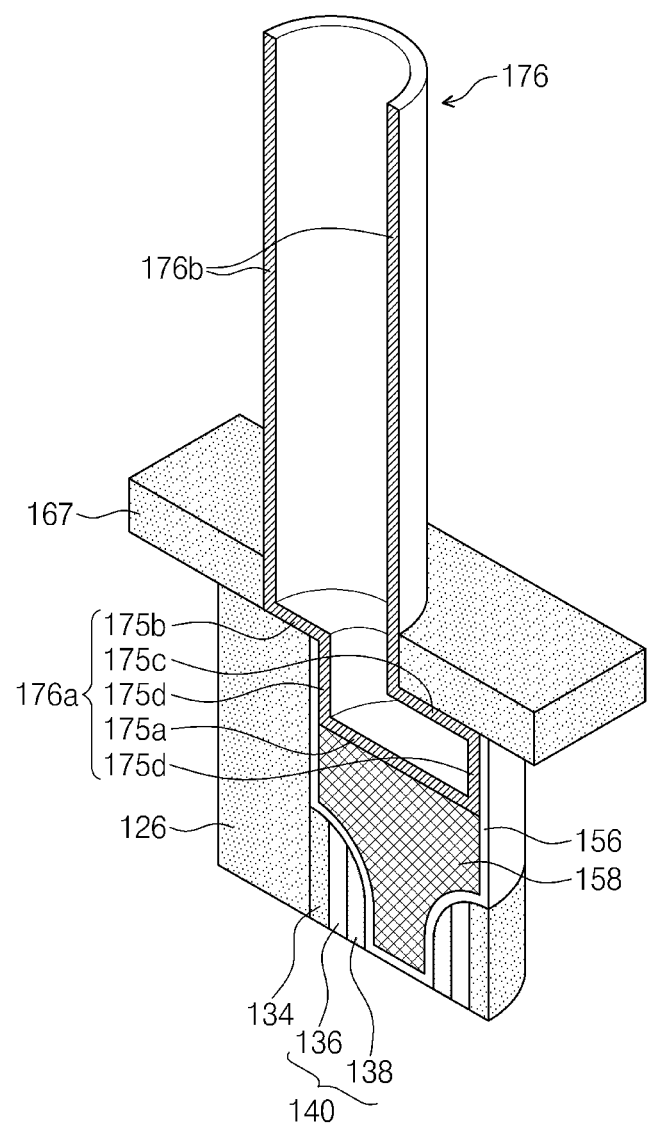
FIG. 1E is an enlarged perspective view illustrating a portion of the semiconductor device of FIG. 1A according to example embodiments.

FIG. 1A is a plan view illustrating a semiconductor device according to example embodiments of the inventive concept. FIG. 1B is a sectional view, taken along line I-I', of the semiconductor device of FIGS. 1A according to example embodiments, 1C is a sectional view, taken along line of the semiconductor device of FIGS. 1A according to example embodiments, 1D is a sectional view, taken along line of the semiconductor device of FIG. 1A according to example embodiments, and FIG. 1E is an enlarged perspective view illustrating a portion of the semiconductor device of FIG. 1A according to example embodiments.

As used herein, a semiconductor device may refer to any of the various devices such as shown in FIGS. 1A-1E, 2A-2C, 3A-3C, . . . , 18A-18C, and 19A-19C, and may also refer, for example, to a transistor or a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic device, as used herein, may refer to one of these devices and may also include products that include these devices, such as a memory module, a hard drive including additional components, a mobile phone, laptop, tablet, desktop, camera, server, computing system, or other consumer electronics device, etc.

Referring to FIGS. 1A through 1E, a semiconductor device may include a substrate 100, transistors TR, bit line structures BLS, capacitors CAP, first contact plugs 124 electrically connecting the transistors TR to the bit line structures BLS, and second contact plugs 148 electrically connecting the transistors TR to the capacitors CAP.

The substrate 100 may be a semiconductor substrate including silicon, germanium, or silicon/germanium, a silicon-on-insulator (SOI) wafer, or a germanium-on-insulator (GOI) wafer.

A device isolation layer 104 may be provided on the substrate 100 to define a plurality of active regions 102. The device isolation layer 104 may be formed of or include at least one of silicon oxide, silicon nitride, or silicon oxynitride.

Each of the transistors TR may include a gate insulating layer 106, a gate electrode 108, a first capping pattern 112, and first and second impurity regions 110a (e.g., source/drain) and 110b (e.g., drain/source). In some embodiments, the transistor TR may be formed to have a channel region positioned below a top surface of the substrate 100 for example, the transistor TR may have a buried channel array transistor (BCAT) structure. However, example embodiments are not limited to these examples, in which the transistor TR has the BCAT structure.

A plurality of recesses extending parallel to a first direction D1 may be formed in the substrate 100, and the gate electrodes 108 may be provided to fill the recesses, respectively. Each of the gate electrodes 108 may have a top surface lower than the top surface of the substrate 100. Each of the gate electrodes 108 may be formed of or include at least one of doped polysilicon, metals (e.g., tungsten or copper), or metal compounds (e.g., titanium nitride).

The gate insulating layer 106 may be disposed between the substrate 100 and the gate electrodes 108. The gate insulating layer 106 may be formed of or include at least one of insulating materials including silicon oxides (e.g., silicon oxide or silicon oxynitride) or metal oxides (e.g., hafnium oxide, aluminum oxide, or zirconium oxide).

The first capping patterns 112 may be respectively provided on the gate electrodes 108 to fill upper regions of the recesses. Each of the first capping patterns 112 may have a top surface that is positioned at a level higher than or equal to the top surface of the substrate 100. The first capping pattern 112 may be formed of or include at least one of silicon oxide, silicon nitride, or silicon oxynitride.

The first and second impurity regions 110a and 110b may be formed in the active region 102 and at both sides of the gate electrode 108. The first and second impurity regions 110a and 110b may serve as source and/or drain regions of the transistors TR.

The semiconductor device may further include first insulating fences 114 interposed between the first capping patterns 112. The second contact plugs 148 may be electrically separated from each other by the first insulating fences 114. Each of the first insulating fences 114 may be formed of or include at least one of silicon oxide, silicon nitride, or silicon oxynitride.

The first contact plugs 124 may be provided to electrically connect the first impurity regions 110a of the transistors TR to the bit line structures BLS. Each of the first contact plugs 124 may be formed of or include doped poly silicon, metals (e.g., tungsten or copper), or metal compounds (e.g., titanium nitride).

The semiconductor device may further include first contact spacers 122, which are respectively provided to enclose the first contact plugs 124. For example, each of the first contact spacers 122 may enclose an outer side surface of the first contact plug 124 having a pillar-shaped structure. The first contact spacer 122 may be formed of or include at least one of silicon oxide, silicon nitride, or silicon oxynitride.

Each of the bit line structures BLS may include a bit line BL, a second capping pattern 126, and bit line spacers 134.

The bit line BL may be electrically connected to the first impurity regions 110a of the transistors TR through the first contact plugs 124. In some embodiments, a plurality of the bit lines BL may be disposed parallel to each other and may extend in a second direction D2 crossing the first direction D1 of FIG. 1A. The second direction D2 may be perpendicular to the first direction D1.

In some embodiments, the bit line BL may include a first conductive pattern 128, a second conductive pattern 130, and a third conductive pattern 132, which are sequentially stacked on the substrate 100. The first conductive pattern 128 may be formed of or include doped poly silicon. The second conductive pattern 130 may be formed of or include silicide materials (e.g., cobalt silicide or titanium silicide) or nitride materials (e.g., aluminum titanium nitride). The third conductive pattern 132 may be formed of or include tungsten silicide or tungsten. The present disclosure has been described with reference to the example in which the bit line BL has a multi-layered structure, but example embodiments are not limited thereto.

The second capping pattern 126 may be disposed on the bit line BL. Accordingly, the second capping pattern 126 may also extend in the second direction D2 of FIG. 1A. The second capping pattern 126 may be formed of or include at least one of silicon oxide, silicon nitride, or silicon oxynitride.

The bit line spacers 134 may be respectively provided on two opposite sides of a stack of the bit line BL and the second capping pattern 126. The bit line spacers 134 may be parallel to each other and extend in the second direction D2 of FIG. 1A. In some embodiments, each of the bit line spacers 134 may be provided to cover a lower portion of the second capping pattern 126 and expose an upper portion of the second capping pattern 126. Each of the bit line spacers 134 may be formed of or include at least one of silicon oxide, silicon nitride, or silicon oxynitride.

The semiconductor device may further include second insulating fences 142 interposed between the second capping patterns 126. The second contact plugs 148 may be electrically separated from each other by the second insulating fences 142. Each of the second insulating fences 142 may be formed of or include at least one of silicon oxide, silicon nitride, or silicon oxynitride. In some embodiments, each of the second insulating fences 142 may have a top surface that is positioned at substantially the same level as those of the second capping patterns 126. The second capping patterns 126 and the second insulating fences 142 may define holes respectively exposing the second contact plugs 148.

The second contact plugs 148 may connect the second impurity regions 110b to the capacitors CAP, respectively.

In some embodiments, each of the second contact plugs 148 may include an upper portion 148b and a lower portion 148a, which is wider than the upper portion 148b. For example, the upper portion 148b of the second contact plug 148 may have a pillar-shaped structure, and the lower portion 148a of the second contact plug 148 may have a ball-shaped structure.

The second contact plug 148 may be formed of or include doped poly silicon, metals (e.g., tungsten or copper), or metal compounds (e.g., titanium nitride). Since the lower portion 148a has a greater width than the upper portion 148b or has a ball-shaped structure, there may be a difficulty in filling the lower portion 148a, and thus a void VOD may be formed in the lower portion 148a of the second contact plug 148.

The semiconductor device may further include second contact spacers 140, which are provided to enclose the second contact plugs 148, respectively. Each of the second contact spacers 140 may enclose an outer side surface of the upper portion 148b of the second contact plug 148. Each of the second contact spacers 140 may be disposed between the bit line spacer 134 and the second contact plug 148 to allow the second contact plugs 148 to have an improved electric isolation property. The second contact spacer 140 may be formed of or include at least one of silicon oxide, silicon nitride, or silicon oxynitride.

In some embodiments, each of the second contact spacers 140 may have a top surface positioned at a higher level than those of the second contact plugs 148. The top surfaces of the second contact spacers 140 may be substantially coplanar with, or lower than, those of the bit line spacers 134.

In certain embodiments, each of the second contact spacers 140 may be provided in the form of a multi-layered structure. The second contact spacer 140 may include a first spacer 136 and a second spacer 138, which are in contact with the bit line spacer 134 and the second contact plug 148, respectively. In example embodiments, the first spacer 136 may be formed of or include silicon oxide, and the second spacer 138 may be formed of or include silicon nitride.

In some embodiments, the semiconductor device may further include contact pads 158 electrically connecting the second contact plugs 148 to the capacitors CAP. In each of the contact pads 158, a lower portion may be narrower than an upper portion, for example, each of the contact pads 158 may have a 'Y'-shaped section, when viewed in a vertical sectional view that is taken to be normal to the top surface of the substrate 100. For example, each of the contact pads 158 may include a lower portion filling a gap defined by the second contact spacer 140 and an upper portion filling a gap defined by the second capping patterns 126 and the second insulating fences 142. A top surface of each of the contact pads 158 may be lower than those of the second capping patterns 126 and the second insulating fences 142.

Each of the contact pads 158 may be formed of or include at least one of metallic materials (e.g., tungsten or copper). In some example embodiments, barrier patterns 156 may be further provided between the second contact plugs 148 and the contact pads 158. For example, if the second contact plugs 148 are formed of doped poly silicon, barrier patterns 156 may be further provided between the second contact plugs 148 and the contact pads 158. Each of the barrier patterns 156 may be extended to at least partially cover a top surface of the second contact plug 148, top and side surfaces of the second contact spacer 140, side surfaces of the second capping patterns 126, and side surfaces of the second insulating fences 142. When viewed in a vertical sectional view, each of the barrier patterns 156 may have a 'Y'-shaped section. Furthermore, each of the barrier patterns 156 may be extended to a lower portion of a bottom electrode 176 of the capacitor CAP.

In some embodiments, the semiconductor device may further include an additional insulating pattern 167 provided on the second capping patterns 126, and the additional insulating pattern 167 may be formed to have a plurality of holes, each of which is formed to at least partially expose a corresponding one of the contact pads 158. The additional insulating pattern 167 may be provided to cover at least a portion of each of the second capping patterns 126. The additional insulating pattern 167 may be vertically spaced apart from the contact pads 158. Furthermore, the additional insulating pattern 167 may be provided in such a way that centers of the holes thereof are laterally shifted from centers of the contact pads 158, respectively.

The additional insulating pattern 167 may be formed of or include substantially the same material as the second capping patterns 126. For example, the additional insulating pattern 167 may be formed of or include silicon oxide, silicon nitride, or silicon oxynitride.

Each of the capacitors CAP may include the bottom electrode 176, a dielectric layer 178, and a top electrode 180.

Each of the bottom electrodes 176 may be provided to be in contact with a corresponding one of the contact pads 158. When viewed in a vertical sectional view, each of the bottom electrodes 176 may include a lower portion 176a and an upper portion 176b. The lower portion 176a may be in contact with a corresponding one of the contact pads 158 and may cover the second capping patterns 126 and the second insulating fences 142. Furthermore, the lower portion 176a may be a bottom surface in contact with the corresponding one of the contact pads 158. The upper portion 176b may be extended from the lower portion 176a to cover a side surface of the additional insulating pattern 167, for example, the upper portion 176b may have a cylindrical structure. For example, as shown in FIG. 1E, the lower portion 176a of the bottom electrode 176 may include a first horizontal portion 175a provided on the top surface of the contact pad 158, a second horizontal portion 175b provided on the top surfaces of the second capping pattern 126 and the second insulating fence 142, a third horizontal portion 175c provided on a bottom surface of the additional insulating pattern 167, and a vertical portion 175d connecting the first horizontal portion 175a to the second and third horizontal portions 175b and 175c. The upper portion 176b of the bottom electrode 176 may have a cylindrical structure vertically extending from the second and third horizontal portions 175b and 175c of the lower portion 176a. The additional insulating pattern 167 may be provided to be in contact with lower outer sidewalls of the upper portions 176b of the bottom electrodes 176. In the bottom electrodes 176 adjacent to each other, the upper portions 176b may be provided in such a way that upper outer sidewalls thereof face each other.

The bottom electrode 176 may include, for example, doped silicon, metals (e.g., tungsten or copper), or metal compounds (e.g., titanium nitride).

The dielectric layer 178 may be provided to conformally cover inner and outer side surfaces of the bottom electrode 176. On the inner surface of the bottom electrode 176, the dielectric layer 178 may be formed to have a substantially uniform thickness, which may be smaller than a radius of bottom electrode 176. The dielectric layer 178 may be formed at least one of silicon oxide or high-k dielectric materials (e.g., aluminum oxide, zirconium oxide, or hafnium oxide).

The top electrode 180 may be provided on the dielectric layer 178 to fill an inner space of the bottom electrode 176 covered with the dielectric layer 178. The top electrode 180 may be formed of or include doped silicon, metals (e.g., tungsten or copper), or metal compounds (e.g., titanium nitride).

FIGS. 2A through 19A are plan views illustrating a method of fabricating a semiconductor device, according to example embodiments of the inventive concept. FIGS. 2B through 19B are sectional views taken along line I-I' of FIGS. 2A through 19A according to example embodiments. FIGS. 2C through 6C are sectional views taken along line II-II' of FIGS. 2A through 6A according to example embodiments. FIGS. 7C through 19C are sectional views taken along line III-III' of FIGS. 7A through 19A according to example embodiments.

Figure 2A:
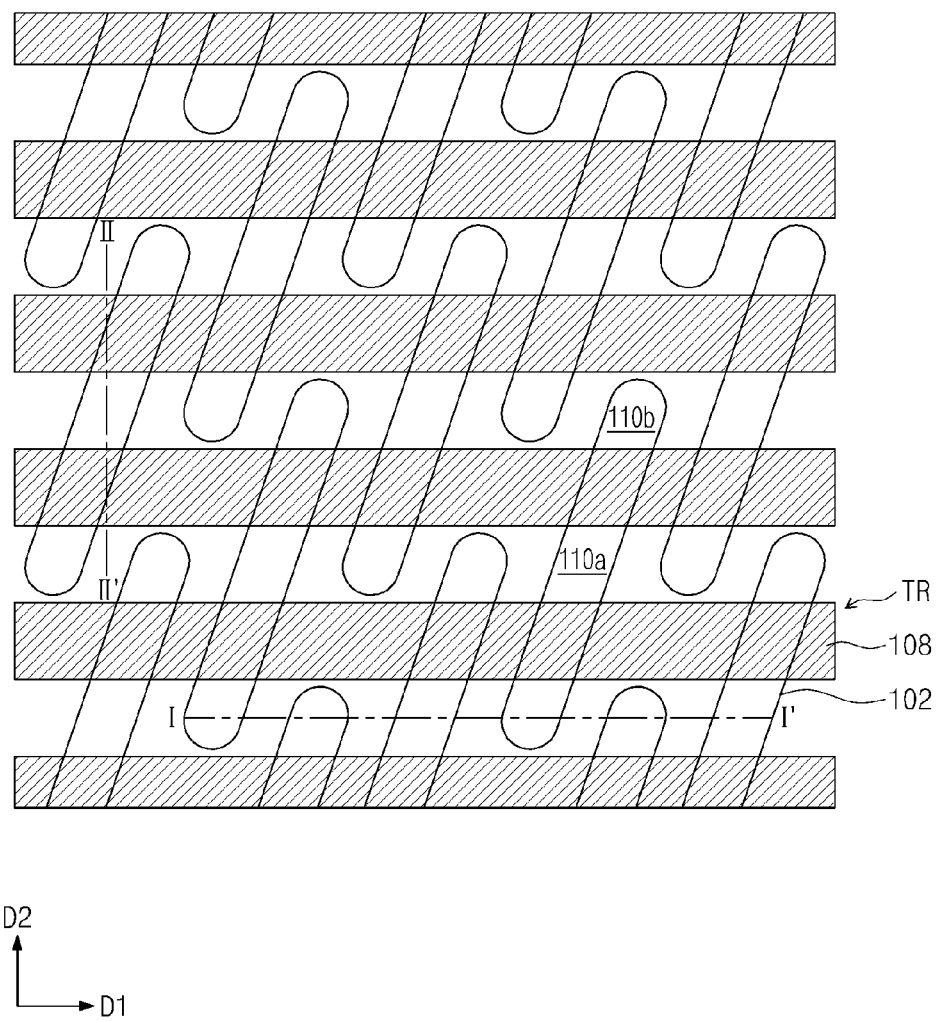
Figure 2B:
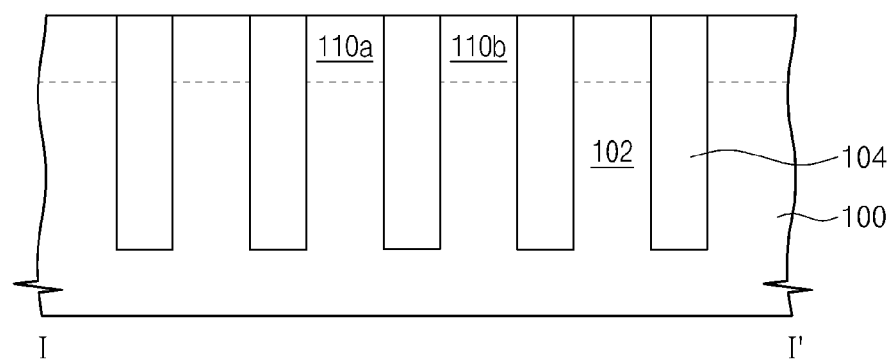
Figure 2C:
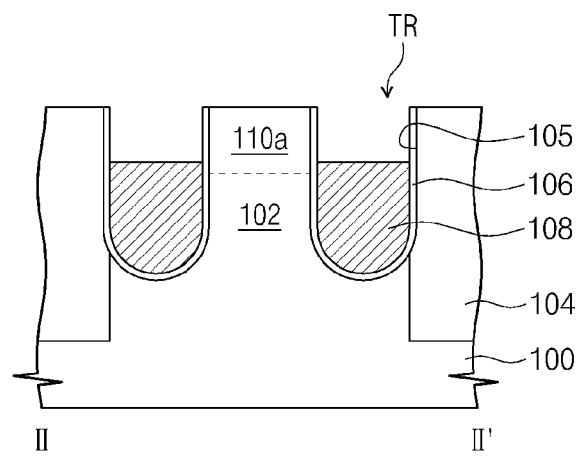

Referring to FIGS. 2A, 2B, and 2C, the device isolation layer 104 and the transistors TR may be formed on the substrate 100.

The formation of the device isolation layer 104 may include patterning the substrate 100 to form a trench (not shown) defining the active regions 102, and then, filling the trench with an insulating material to form the device isolation layer 104. The insulating material for the device isolation layer 104 may include at least one of silicon oxide, silicon nitride, or silicon oxynitride.

Thereafter, the substrate 100 may again be patterned to form recesses 105 extending in the first direction D1 of FIG. 2A or crossing the device isolation layer 104 and the active regions 102. The gate insulating layer 106 may be formed to conformally cover the substrate 100 with the recesses 105. The gate insulating layer 106 may be formed by a thermal oxidation process of oxidizing an exposed silicon surface of the substrate 100, for example, the gate insulating layer 106 may be a silicon oxide layer. In other example embodiments, the gate insulating layer 106 may be formed by performing a deposition process on the substrate 100 with the recesses 105, for example, the gate insulating layer 106 may be formed of at least one of silicon oxide, hafnium oxide, aluminum oxide, or zirconium oxide.

The gate electrodes 108 may be formed on the gate insulating layer 106 to fill lower regions of the recesses 105. The gate electrodes 108 may be formed of or include at least one of doped polysilicon, metals (e.g., tungsten or copper), or metal compounds (e.g., titanium nitride). The first and second impurity regions 110a and 110b may be formed by, for example, injecting dopants into the active region 102 at both sides of the gate electrodes 108. As a result, the transistors TR including the gate insulating layer 106, the gate electrodes 108, and the first and second impurity regions 110a and 110b may be formed.

Figure 3A:
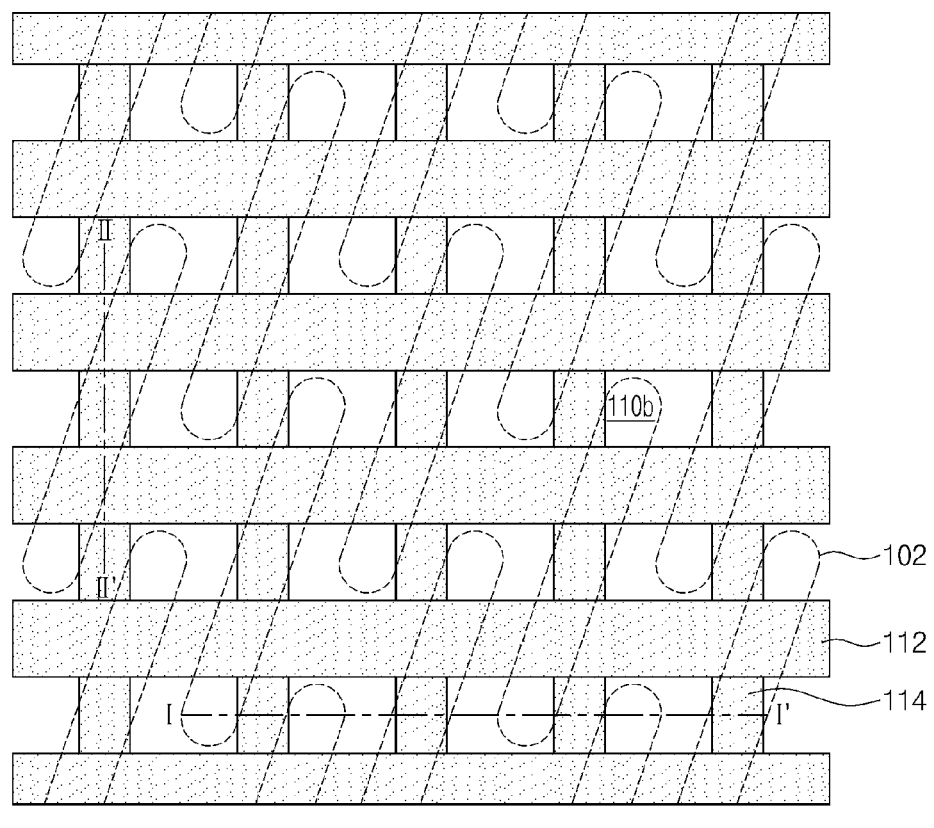
Figure 3B:
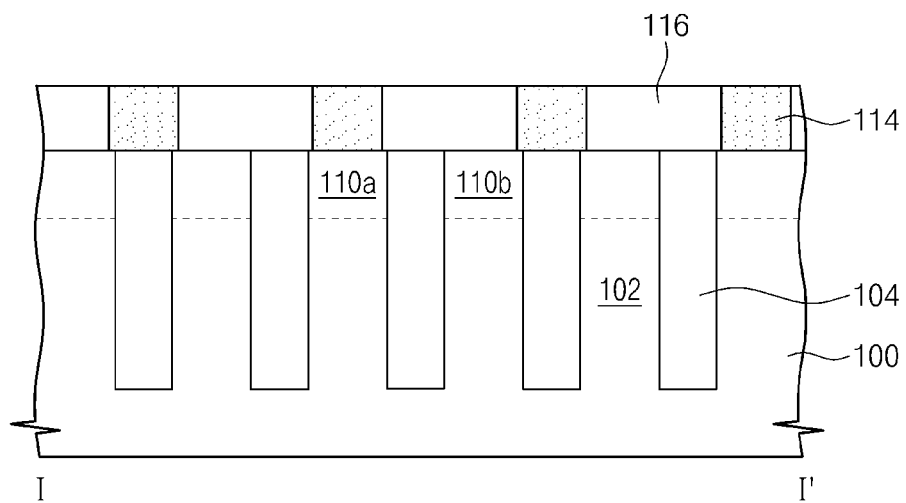
Figure 3C:
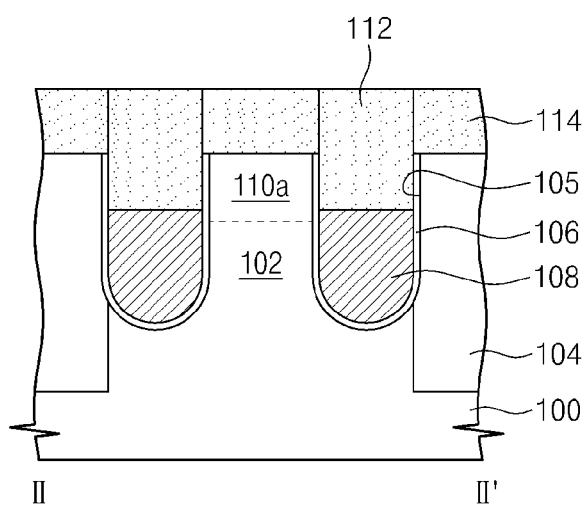

Referring to FIGS. 3A, 3B, and 3C, the first capping patterns 112 may be formed on the gate electrode 108 to fill upper regions of the recesses 105.

For example, the formation of the first capping patterns 112 may include forming a first insulating layer (not shown) on the substrate 100 to fill the upper regions of the recesses 105. The first insulating layer may be formed of or include at least one of silicon oxide, silicon nitride, or silicon oxynitride. Thereafter, the first insulating layer may be etched to form the first capping patterns 112, which are respectively disposed on the gate electrodes 108 and extend in the first direction D1 of FIG. 3A. The first capping patterns 112 may be formed to have top surfaces that are higher than that of the substrate 100.

In some embodiments, the first insulating fences 114 may be formed between the first capping patterns 112, when the first insulating layer is etched. The first insulating fences 114 may be formed to expose the second impurity regions 110b. The first insulating fences 114 may be used to electrically separate the second contact plugs 148, which will be formed in a subsequent process, from each other. Each of the first insulating fences 114 may be formed to have a top surface that is substantially coplanar with those of the first capping patterns 112.

Thereafter, a first interlayered insulating layer 116 may be formed between the first capping patterns 112 and the first insulating fences 114. The first interlayered insulating layer 116 may be formed of or include at least one of materials having an etch selectivity with respect to the first insulating layer. The first interlayered insulating layer 116 may be formed of or include at least one of silicon oxide, silicon nitride, or silicon oxynitride. For example, the first capping patterns 112 and the first insulating fences 114 may be formed of or include silicon nitride, and the first interlayered insulating layer 116 may be formed of or include silicon oxide.

Figure 4A:
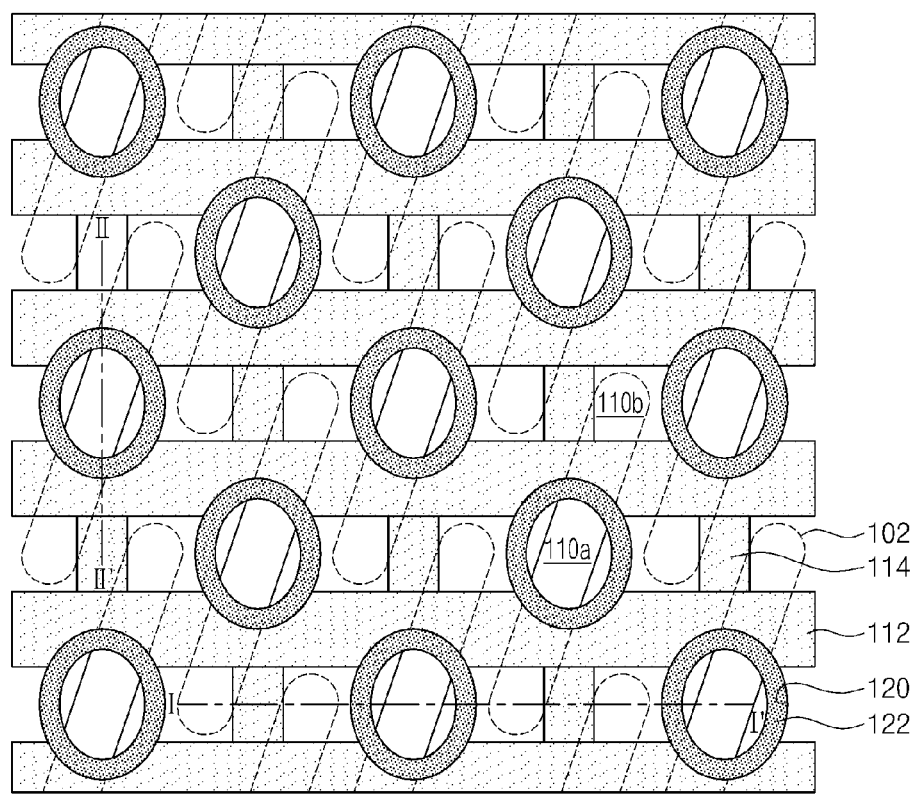
Figure 4A:
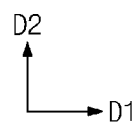
Figure 4B:
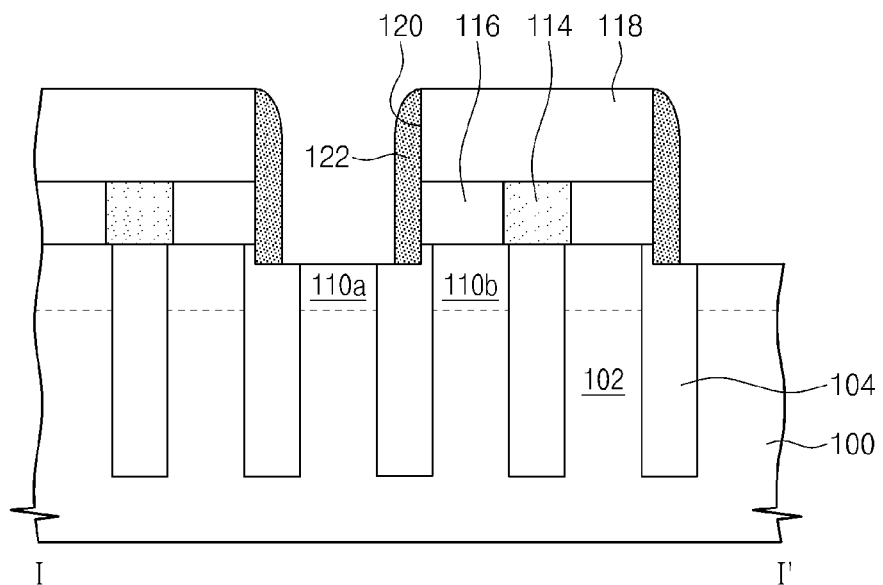
Figure 4C:
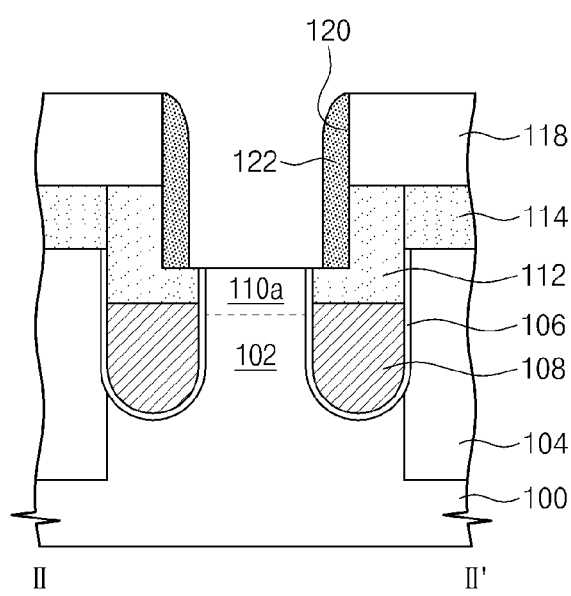

Referring to FIGS. 4A, 4B, and 4C, a second interlayered insulating layer 118 may be formed on the first interlayered insulating layer 116, and then, first contact holes 120 may be formed to expose the first impurity regions 110a. The second interlayered insulating layer 118 may include at least one of materials having an etch selectivity with respect to the first insulating layer. The second interlayered insulating layer 118 may be formed of or include at least one of silicon oxide, silicon nitride, or silicon oxynitride.

The first contact spacers 122 may be formed on inner sidewalls of the first contact holes 120, respectively. For example, the formation of the first contact spacers 122 may include forming a second insulating layer (not shown) to conformally cover the second interlayered insulating layer 118 having the first contact holes 120. The second insulating layer may include a material having an etch selectivity with respect to the first and second interlayered insulating layers 116 and 118. For example, the second insulating layer may be formed of or include at least one of silicon oxide, silicon nitride, or silicon oxynitride. Thereafter, the second insulating layer may be anisotropically etched to form the first contact spacers 122 on the inner sidewalls of the first contact holes 120.

Figure 5A:
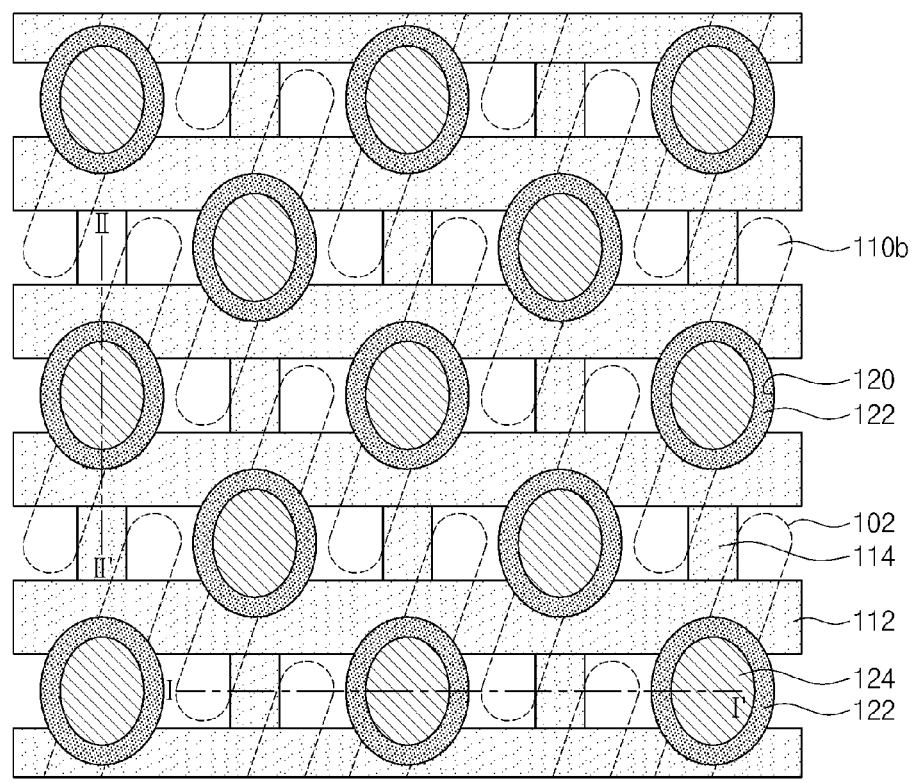
Figure 5A:
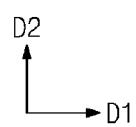
Figure 5B:
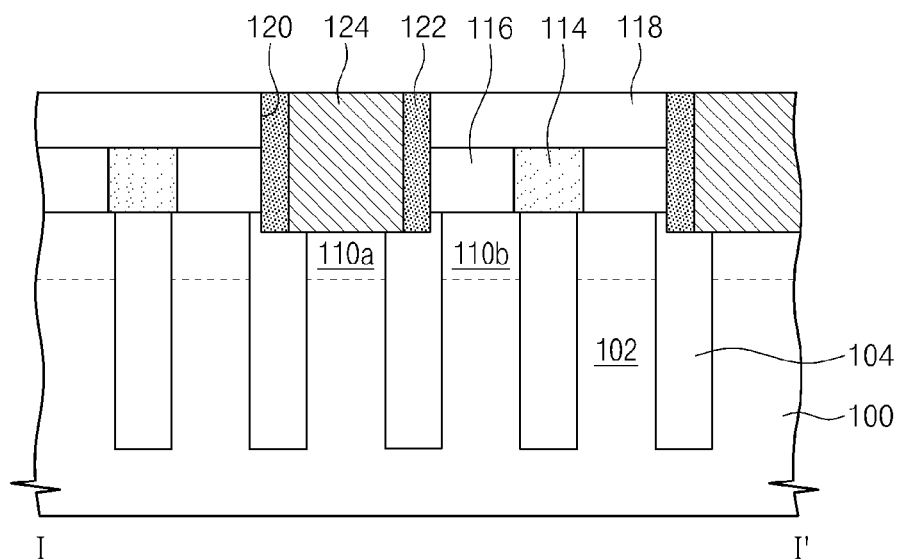
Figure 5C:
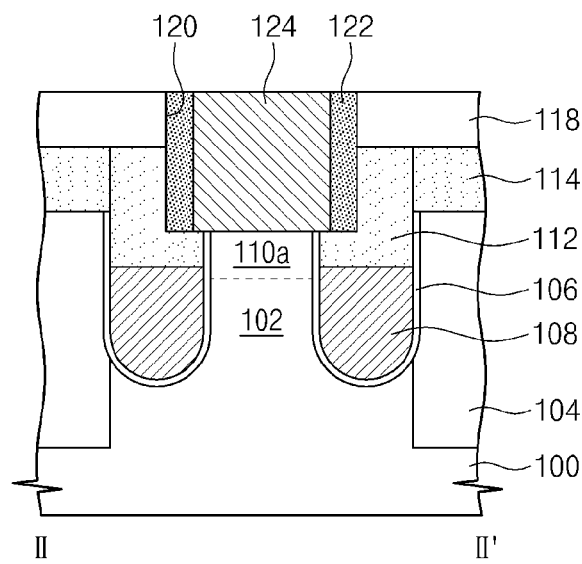

Referring to FIGS. 5A, 5B, and 5C, a conductive layer may be formed to fill the first contact holes 120 and may be etched to expose the second interlayered insulating layer 118, and thus, the first contact plugs 124 may be formed in the first contact holes 120, respectively. The first contact plugs 124 may be formed of or include at least one of doped poly silicon, metals (e.g., tungsten or copper), or metal compounds (e.g., titanium nitride).

Figure 6A:
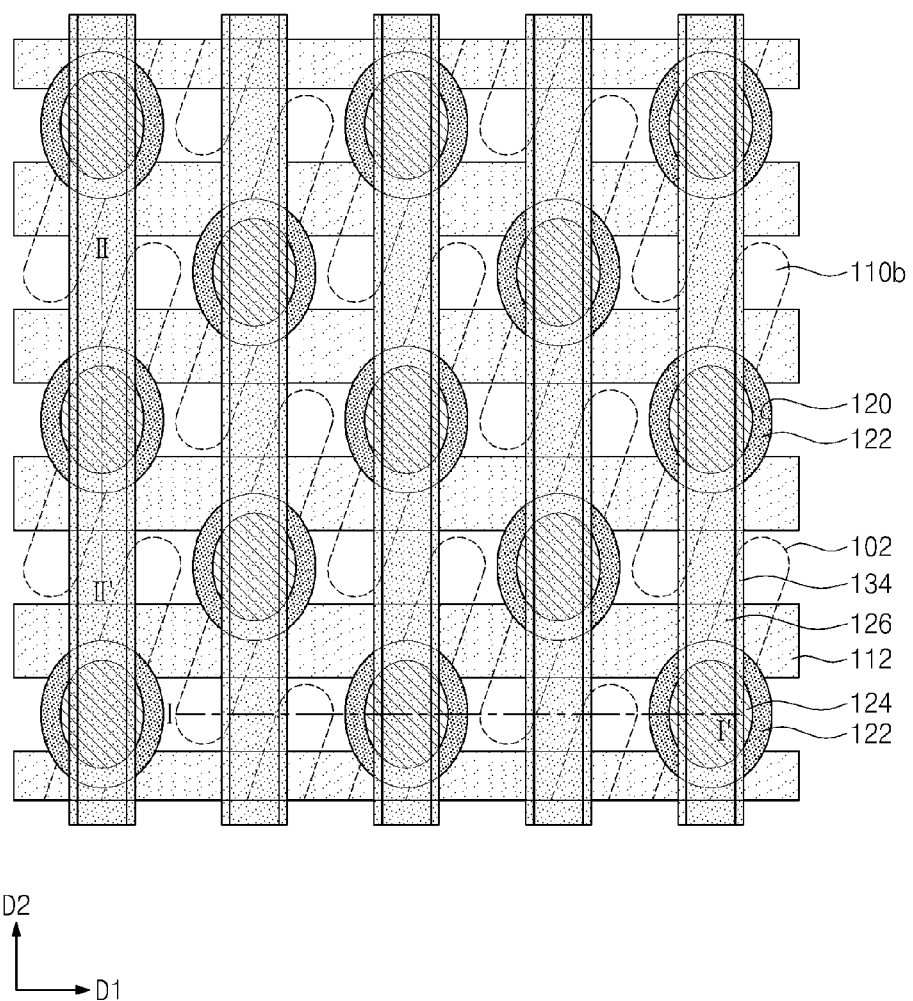
Figure 6B:
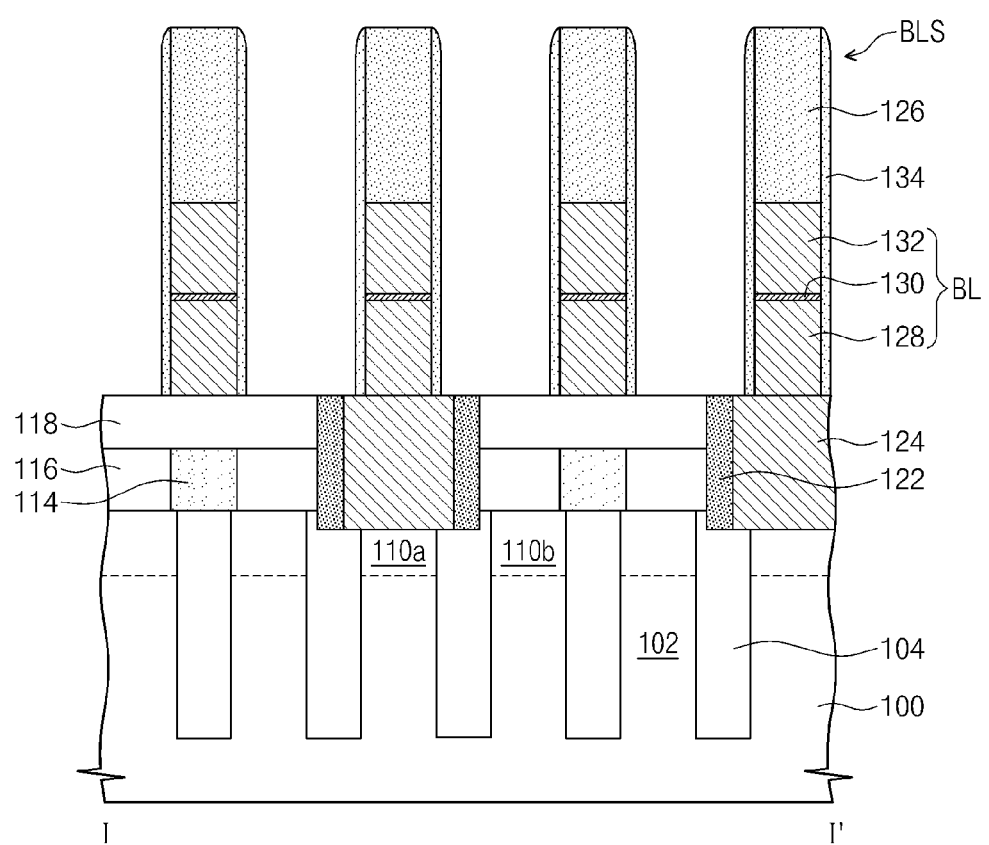
Figure 6C:
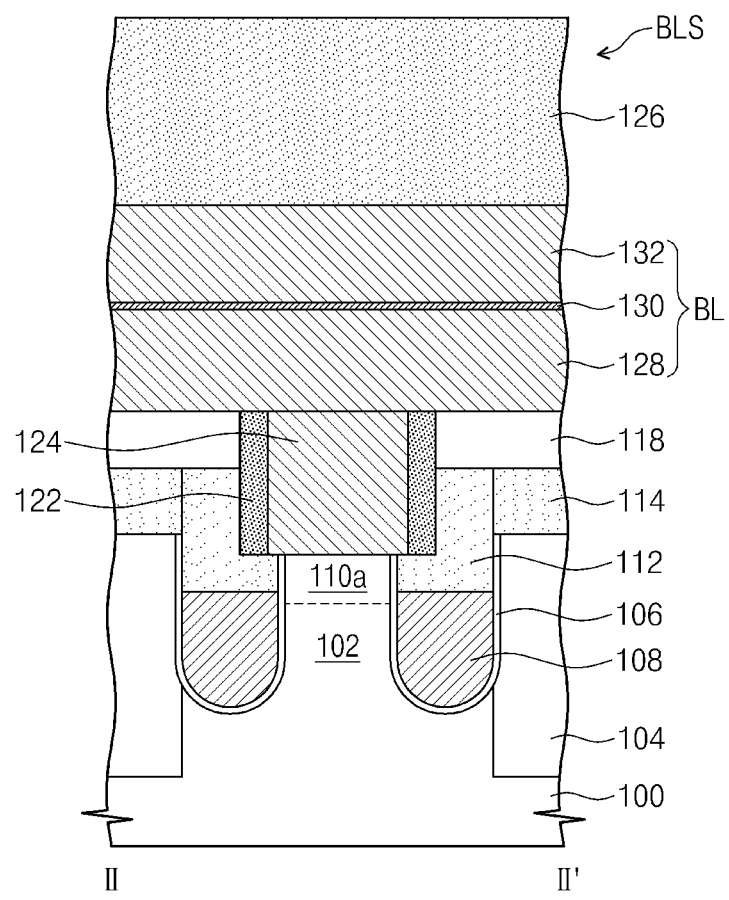

Referring to FIGS. 6A, 6B, and 6C, the bit line structure BLS may be formed on and electrically connected to the first contact plugs 124.

In example embodiments, a conductive layer (not shown) may be formed on the second interlayered insulating layer 118 provided with the first contact plugs 124. The conductive layer may have a multi-layered structure. For example, the conductive layer may include a first conductive layer (not shown), a second conductive layer (not shown), and a third conductive layer (not shown) sequentially stacked on the second interlayered insulating layer 118. For example, the first conductive layer may be formed of or include a doped poly silicon layer, the second conductive layer may be formed of or include a silicide layer (e.g., cobalt silicide or titanium silicide) or a nitride layer (e.g., aluminum titanium nitride), and the third conductive layer may be formed of or include a tungsten silicide layer or a tungsten layer.

A third insulating layer (not shown) may be formed on the third conductive layer. The third insulating layer may be formed of or include a material having an etch selectivity with respect to the first and second interlayered insulating layers 116 and 118. The third insulating layer may be formed of or include at least one of silicon oxide, silicon nitride, or silicon oxynitride. For example, in the case where the first and second interlayered insulating layers 116 and 118 include silicon oxide, the third insulating layer may be formed of or include silicon nitride.

A mask pattern (not shown) may be formed on the third insulating layer, and the third insulating layer, the third conductive layer, the second conductive layer, and the first conductive layer may be etched using the mask pattern as an etch mask to form the second capping patterns 126, the third conductive patterns 132, the second conductive patterns 130, and the first conductive patterns 128. The first to third conductive patterns 128, 130, and 132 may constitute a stack serving as the bit line BL. In some embodiments, a plurality of such bit lines BL may be provided to be parallel to each other and each of them may extend in the second direction D2 perpendicular to the first direction D1 of FIG. 6A.

Thereafter, the bit line spacers 134 may be formed on both side surfaces of each of the bit line structures BLS, each of which includes the bit line BL and the second capping pattern 126. For example, the formation of the bit line spacers 134 may include forming a fourth insulating layer (not shown) to conformally cover the second interlayered insulating layer 118 provided with the bit lines BL and the second capping patterns 126. The fourth insulating layer may include at least one of materials having an etch selectivity with respect to the second interlayered insulating layer 118. The fourth insulating layer may be formed of or include at least one of silicon oxide, silicon nitride, or silicon oxynitride. For example, in the case where the second interlayered insulating layer 118 includes silicon oxide, the fourth insulating layer may include silicon nitride. Thereafter, the fourth insulating layer may be anisotropically etched to form the bit line spacers 134 extending in the second direction D2.

Figure 7A:
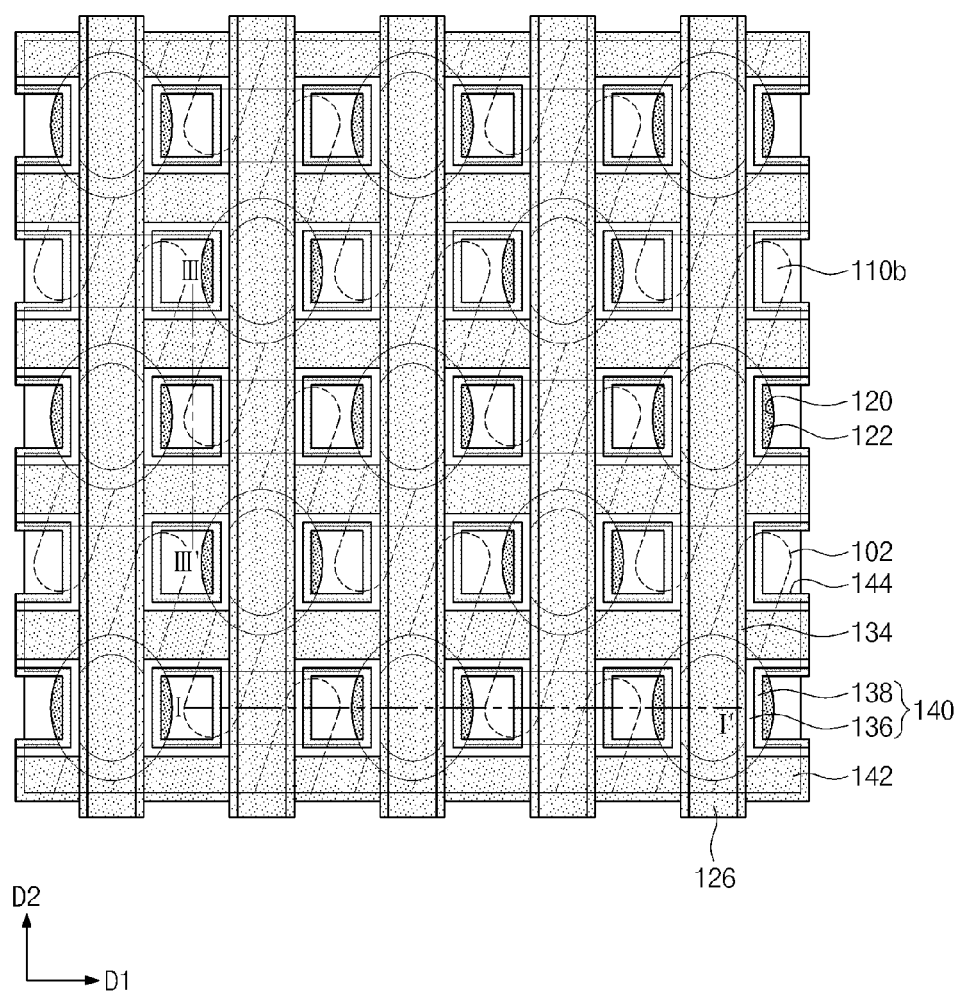
Figure 7B:
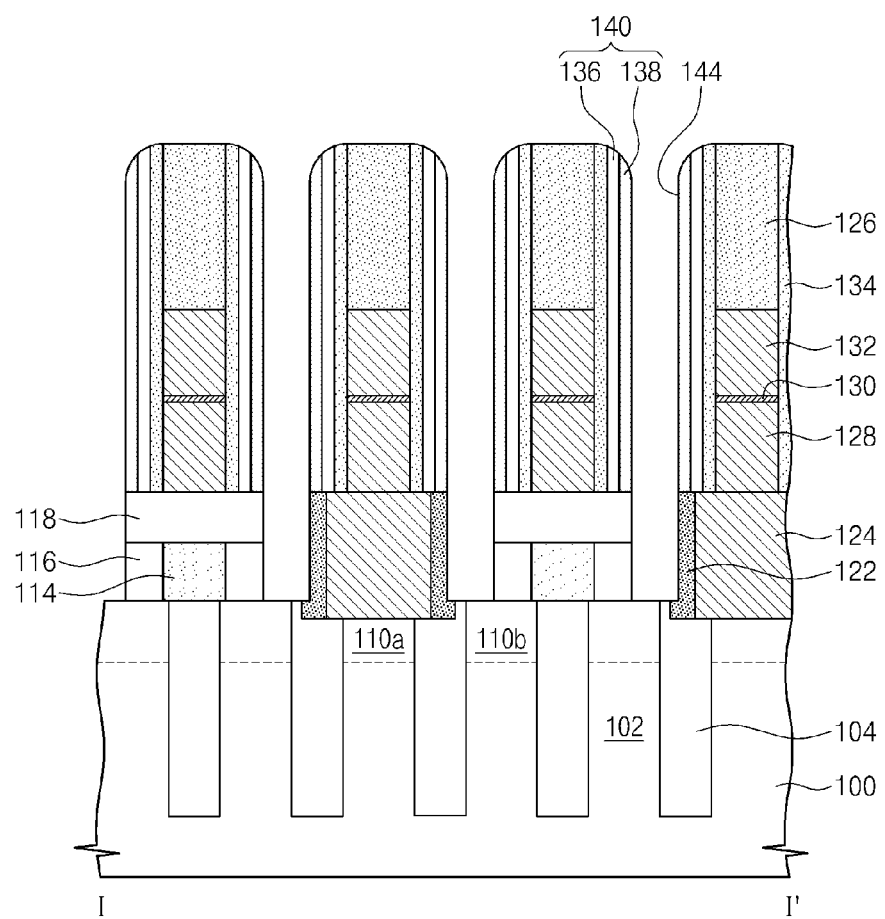
Figure 7C:
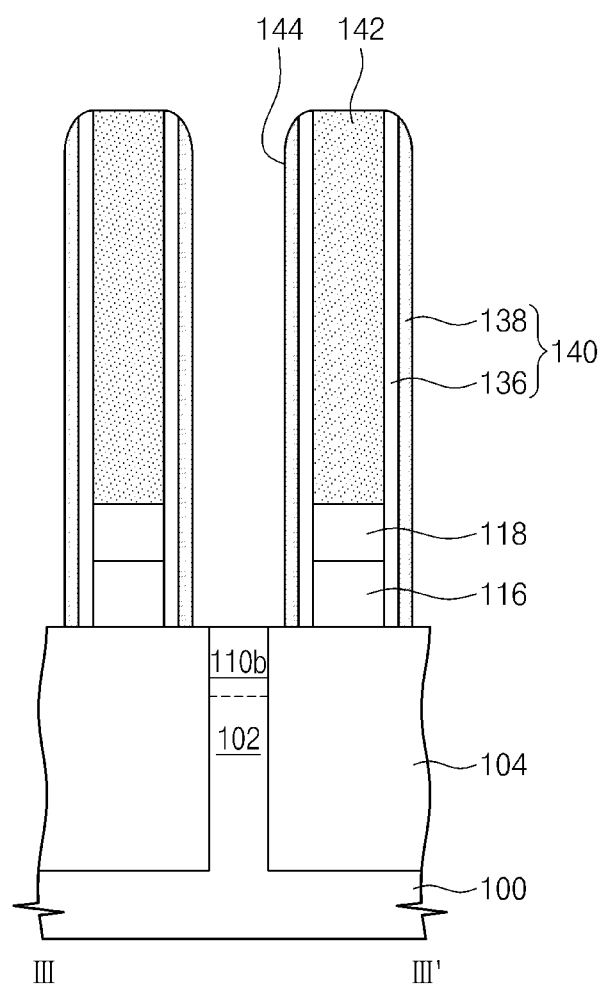

Referring to FIGS. 7A, 7B, and 7C, the second insulating fences 142 and the second contact spacers 140 may be formed between the second capping patterns 126.

For example, a fifth insulating layer (not shown) may be formed on the bit line structures BLS. The fifth insulating layer may be formed of or include at least one of silicon oxide, silicon nitride, or silicon oxynitride. The fifth insulating layer and the first and second interlayered insulating layers 116 and 118 may be etched to form the second insulating fences 142. The second capping patterns 126 and the second insulating fences 142 may be formed to define preliminary second contact holes 144 therebetween. Each of the preliminary second contact holes 144 may be formed to at least partially expose a corresponding one of the first impurity regions 110a. In some embodiments, upper and lower portions of the preliminary second contact holes 144 may be formed to have substantially the same width.

The second contact spacers 140 may be formed on inner sidewalls of the preliminary second contact holes 144, respectively. Each of the second contact spacers 140 may be a multi-layered structure, as shown in FIGS. 7B and 7C. For example, each of the second contact spacers 140 may include the first spacer 136 and the second spacer 138, which are sequentially stacked on the inner sidewall of the preliminary second contact hole 144. The first and second spacers 136 and 138 may be formed of or include the same material or different materials. Each of the first and second spacers 136 and 138 may be formed of or include at least one of silicon oxide, silicon nitride, or silicon oxynitride. For example, the first spacer 136 may be formed of or include silicon oxide, and the second spacer 138 may be formed of or include silicon nitride.

Figure 8A:
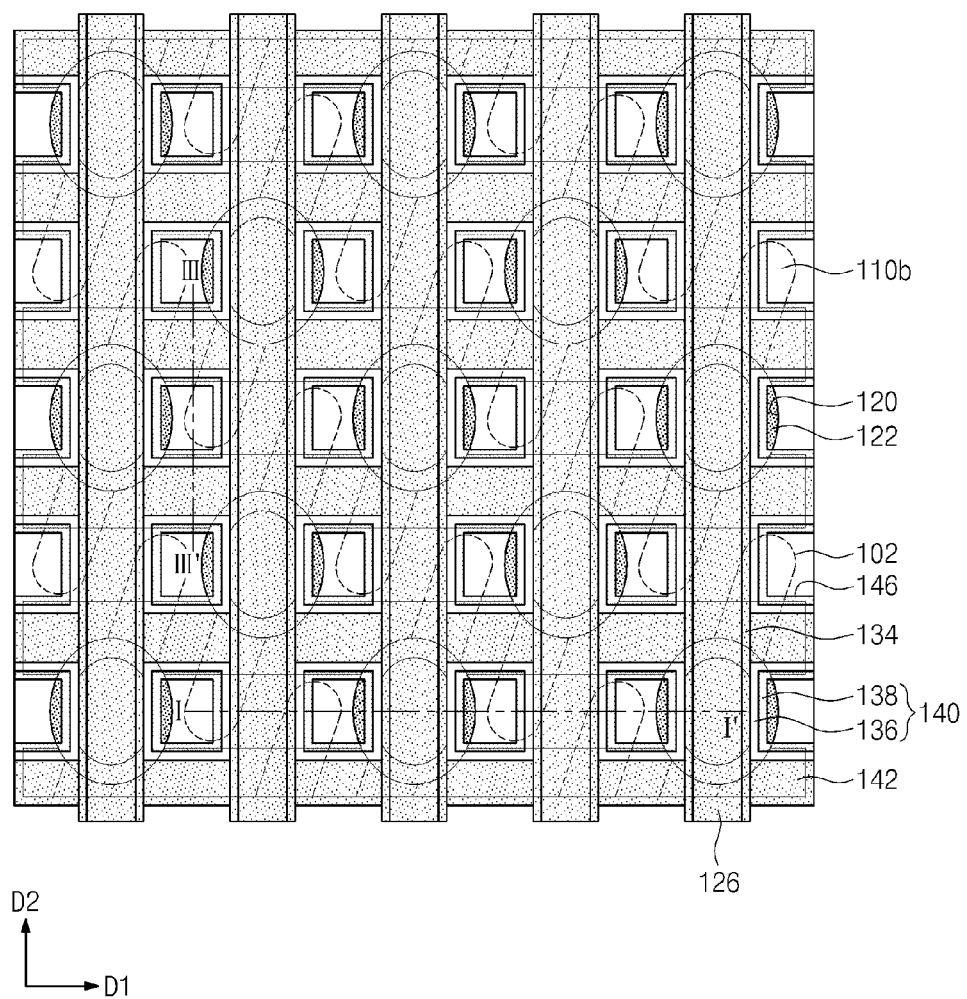
Figure 8B:
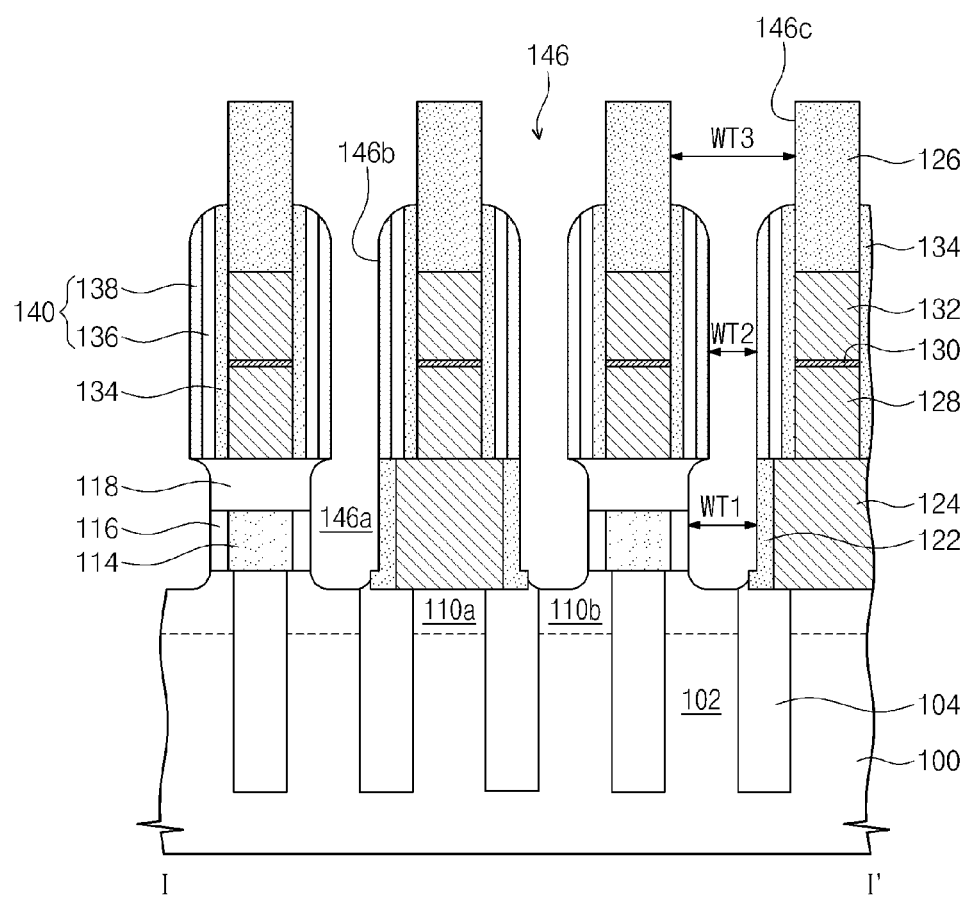
Figure 8C:
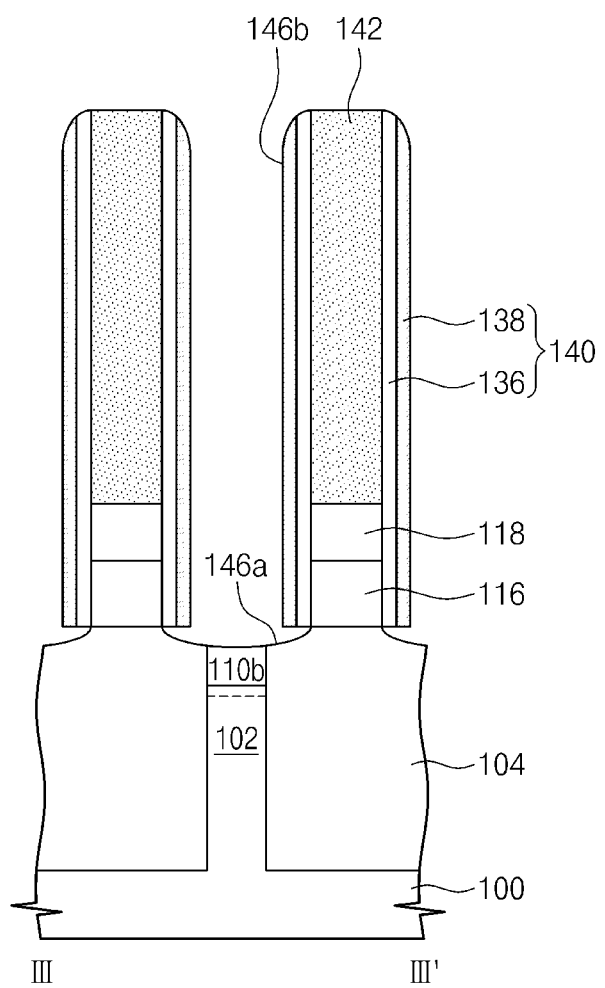

Referring to FIGS. 8A, 8B, and 8C, the first and second interlayered insulating layers 116 and 118 may be etched to expand lower regions of the preliminary second contact holes 144, and thus, second contact holes 146 may be formed.

For example, the first and second interlayered insulating layers 116 and 118 may be isotropically etched through the preliminary second contact holes 144 to expand the lower regions of the preliminary second contact holes 144. In the case where the first and second contact spacers 140 include silicon nitride and the first and second interlayered insulating layers 116 and 118 include silicon oxide, the first and second contact spacers 122 and 140 may be prevented from being etched when the first and second interlayered insulating layers 116 and 118 are etched. Each of the second contact holes 146 may include a first region 146a, a second region 146b, and a third region 146c from a bottom to a top of the respective first holes. For example, the first region 146a may be located between the first interlayered insulating layer 116 and the first contact spacer 122 and/or between the second interlayered insulating layer 118 and the first contact spacer 122, the second region 146b may be located between the adjacent second contact spacers 140, and the third region 146c may be located between exposed upper portions of the adjacent second capping patterns 126. The first region 146a may have a first width WT1, the second region 146b may have a second width WT2 smaller than the first width WT1, and the third region 146c may have a third width WT3 greater than the second width WT2. As a result of the isotropic etching process, the first region 146a of the second contact hole 146 may have a ball-shaped structure.

An etching process may be performed to etch upper portions of the second contact spacers 140 and the bit line spacers 134, and thus, upper portions of the second capping patterns 126 may be exposed through the second contact holes 146. In some embodiments, the etching process may be performed using an anisotropic etching process. In certain embodiments, the etching process may be performed using the etching process for forming the second contact holes 146 from the preliminary second contact holes 144.

Figure 9A:
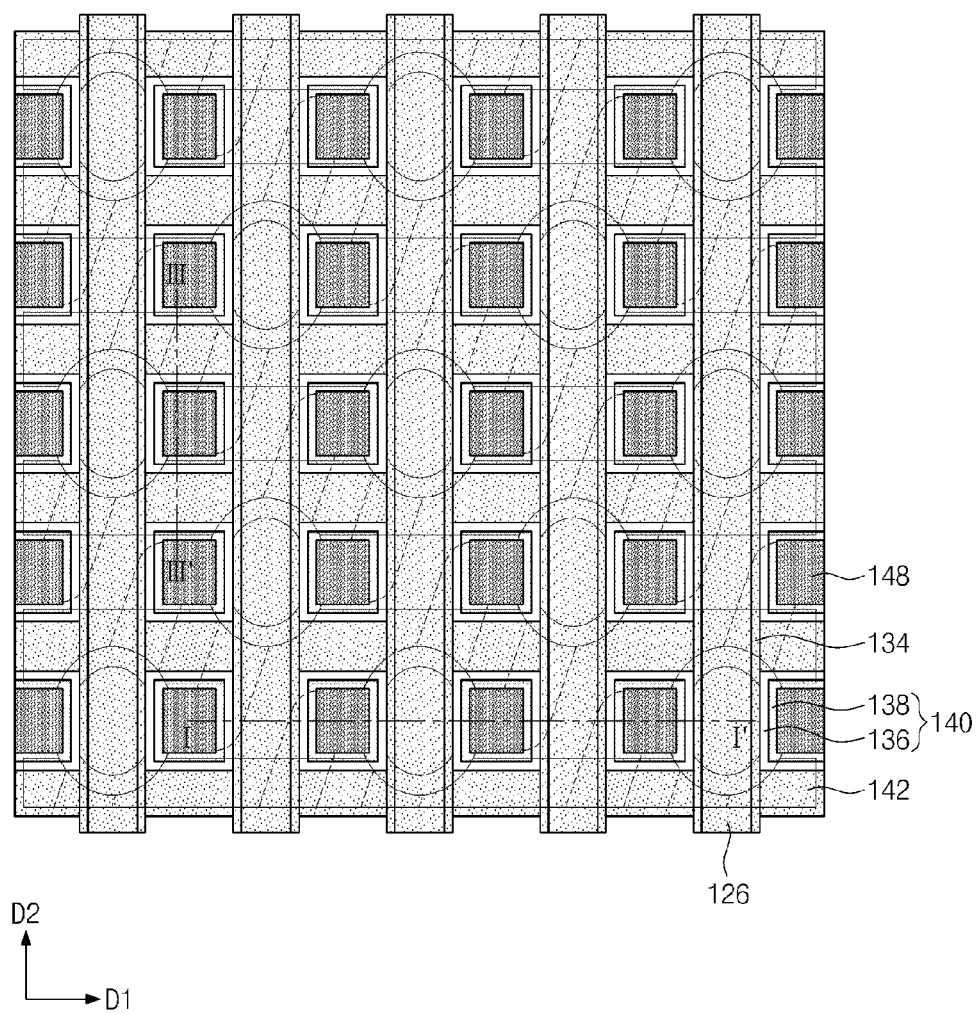
Figure 9B:
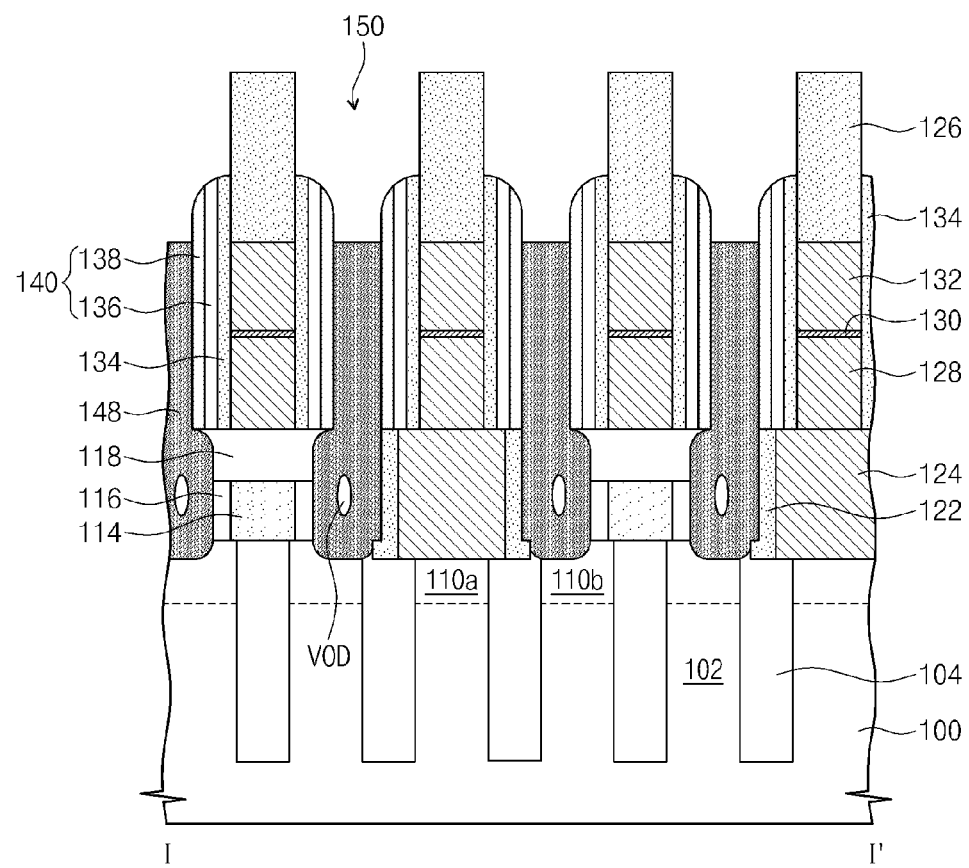
Figure 9C:
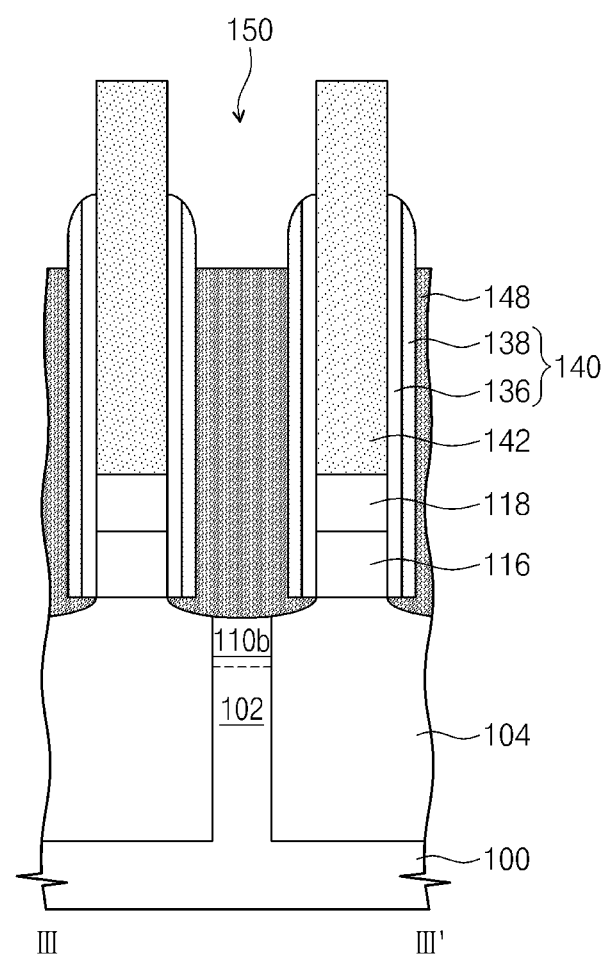

Referring to FIGS. 9A, 9B, and 9C, the second contact plugs 148 may be formed to fill the second contact holes 146, respectively.

For example, the formation of the second contact plugs 148 may include forming a fourth conductive layer (not shown) on the second capping patterns 126 to fill the second contact holes 146. The fourth conductive layer may include doped poly silicon, metals (e.g., tungsten or copper), or metal compounds (e.g., titanium nitride). Thereafter, an etch-back process may be performed on the fourth conductive layer to expose the upper portions of the second contact spacers 140, and thus, the second contact plugs 148 may be formed to connect to the second impurity regions 110b in the second contact holes 146, respectively.

Third contact holes 150, which are defined by the second contact spacer 140, the second capping patterns 126 and the second insulating fences 142, may be formed on the second contact plugs 148, respectively. For example, the third contact holes 150 may include the third regions 146c of the second contact holes 146 and upper portions of the second regions 146b of the second contact holes 146. In each of the third contact holes 150, a lower portion may have a width smaller than that of an upper portion; for example, each of the third contact holes 150 may have a 'Y'-shaped vertical section.

In each of the second contact holes 146, the second region 146b may have a width smaller than that of the first region 146a (i.e., WT2<WT1), and thus, during a process of filling the second contact holes 146 with the fourth conductive layer, the void VOD may be formed in the first region 146*a* of at least one of the second contact holes 146.

Figure 10A:
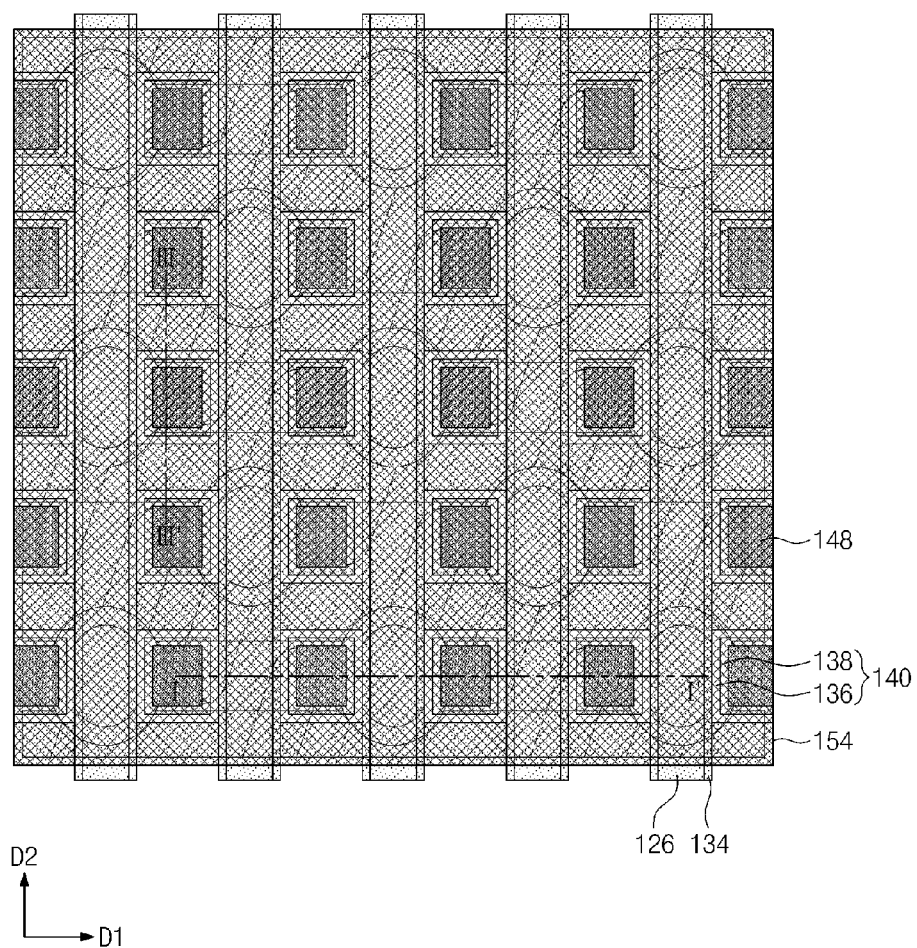
Figure 10B:
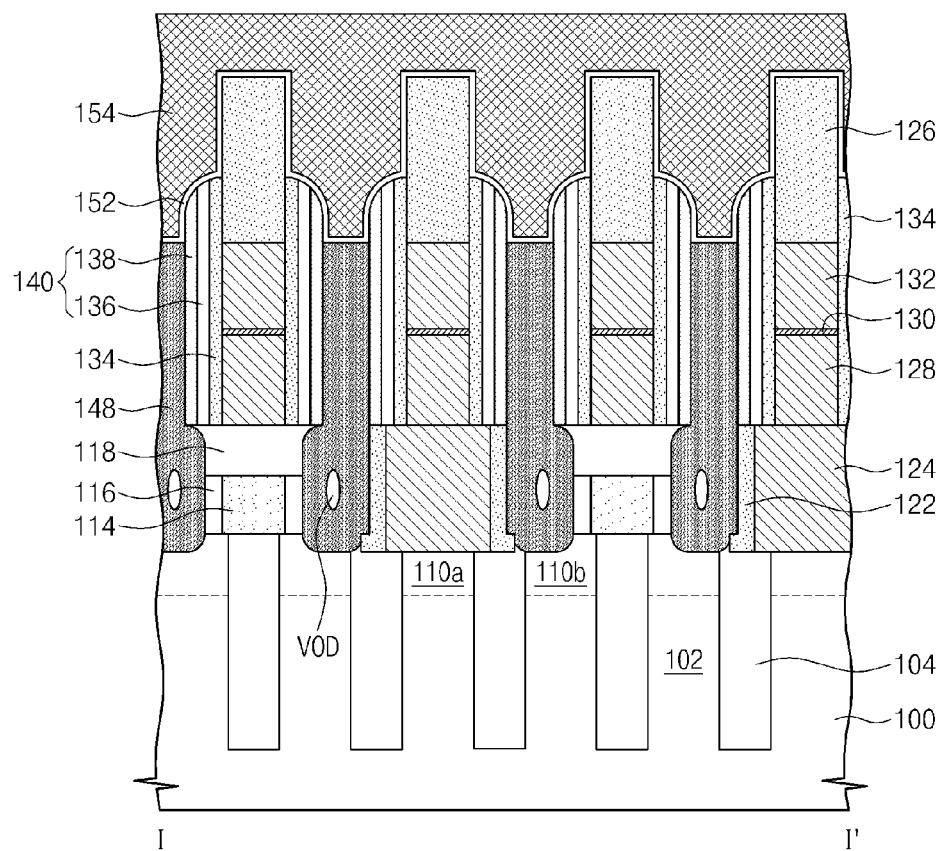
Figure 10C:
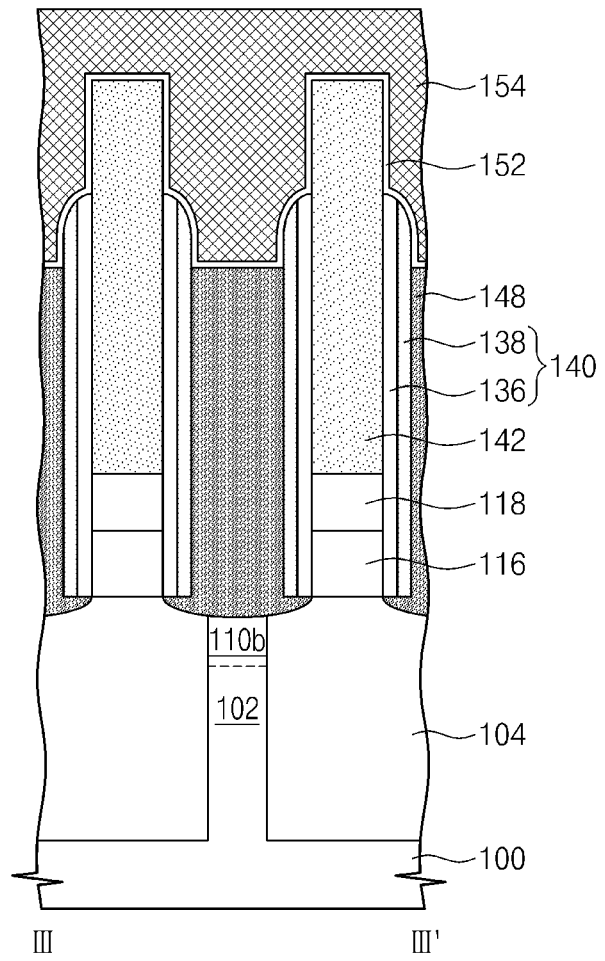

Referring to FIGS. 10A, 10B, and 10C, a barrier layer 152 may be formed to conformally cover the second contact plugs 148, the second contact spacers 140, the second capping patterns 126, and the second insulating fences 142. The barrier layer 152 may be formed to prevent the third contact holes 150 from being completely filled therewith. The barrier layer 152 may be formed of or include titanium nitride.

Thereafter, a fifth conductive layer 154 may be formed on the barrier layer 152 to fill the third contact holes 150. The fifth conductive layer 154 may be formed of or include at least one of metallic materials (e.g., tungsten or copper).

Figure 11A:
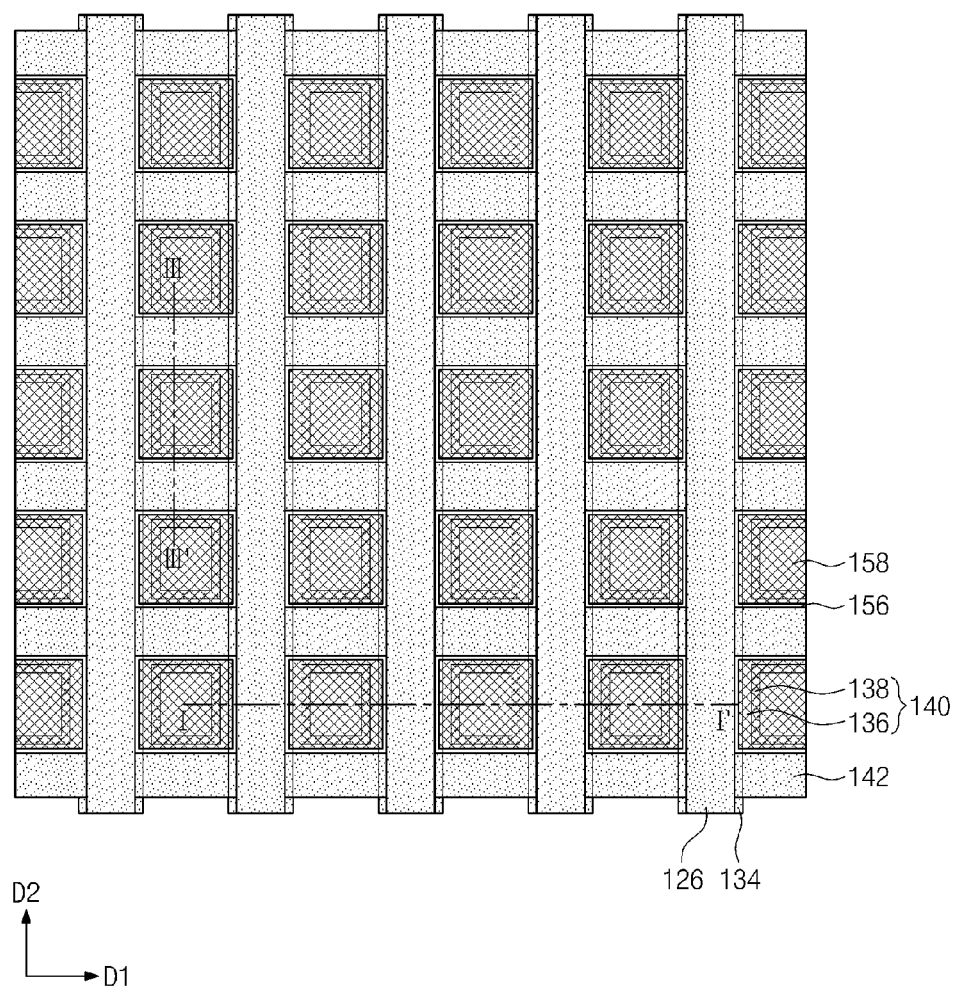
Figure 11B:
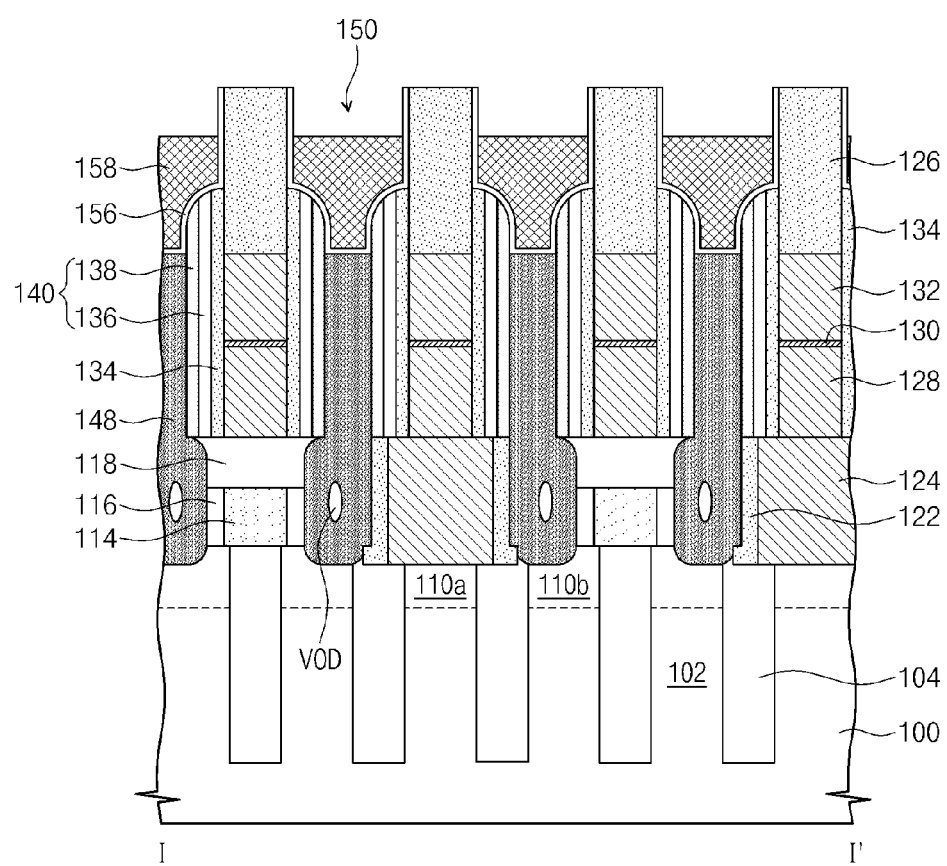
Figure 11C:
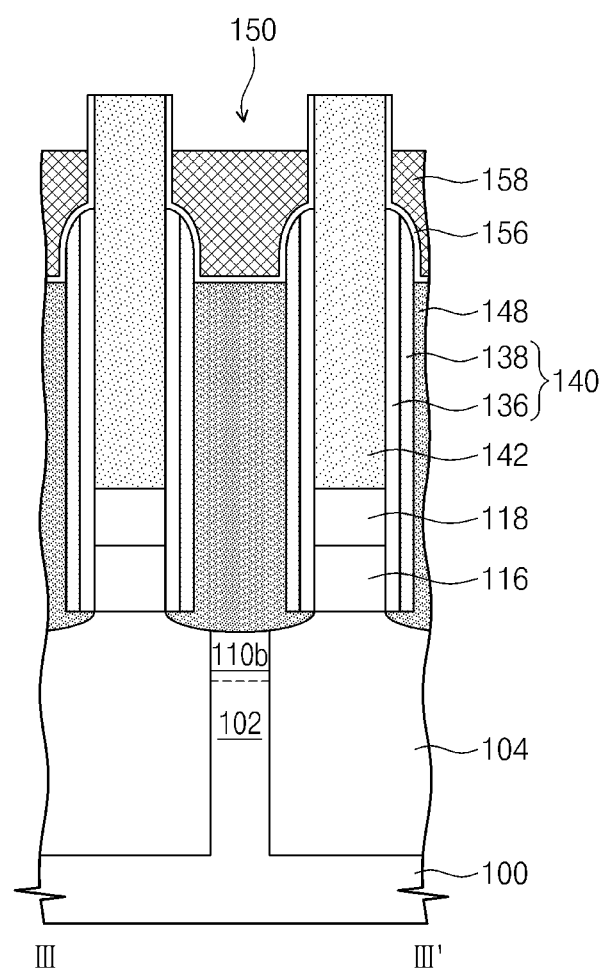

Referring to FIGS. 11A, 11B, and 11C, the fifth conductive layer 154 and the barrier layer 152 may be etched to form the contact pads 158 and the barrier patterns 156, respectively.

In example embodiments, an etch-back process may be performed on the fifth conductive layer 154 and the barrier layer 152. For example, the top surface of the fifth conductive layer 154 may be etched to expose the top surface of the barrier layer 152, and then, the barrier layer 152 may be etched to form the barrier patterns 156 exposing the second capping patterns 126 and the second insulating fences 142. Thereafter, the fifth conductive layer 154 may be further etched to form the contact pads 158. The contact pads 158 may be formed to have top surfaces lower than those of the second capping patterns 126 and the second insulating fences 142.

The contact pads 158 may be formed to fill lower regions of the third contact holes 150, respectively. For example, upper regions of the third contact holes 150 may not be filled with the contact pads 158.

In the case where, as described above, the contact pads 158 are formed by forming the fifth conductive layer 154 in the third contact holes 150 and performing the etch-back process on the fifth conductive layer 154, the second contact plugs 148 and the contact pads 158 may be self-aligned to each other. In addition, it is possible to form the contact pads 158 without an additional photolithography process and consequently to reduce time and cost required for fabricating the semiconductor device.

Figure 12A:
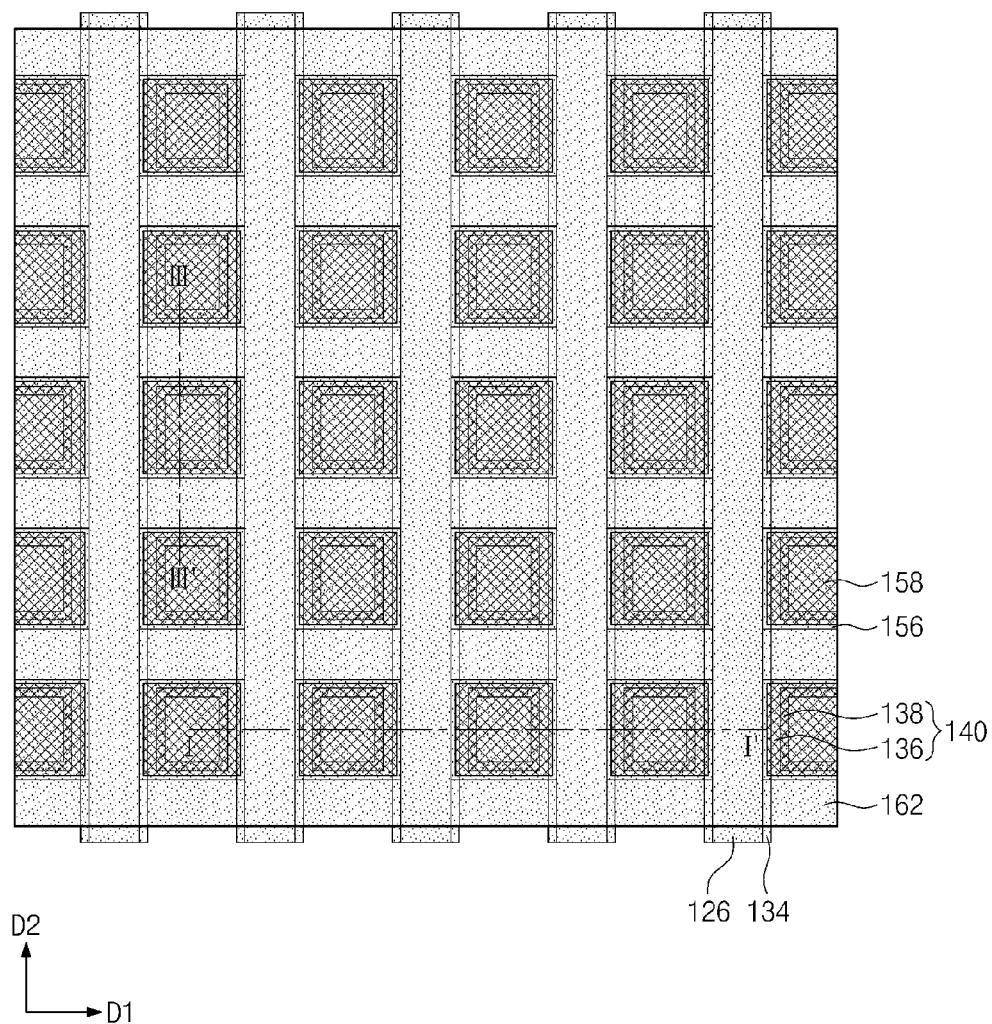
Figure 12B:
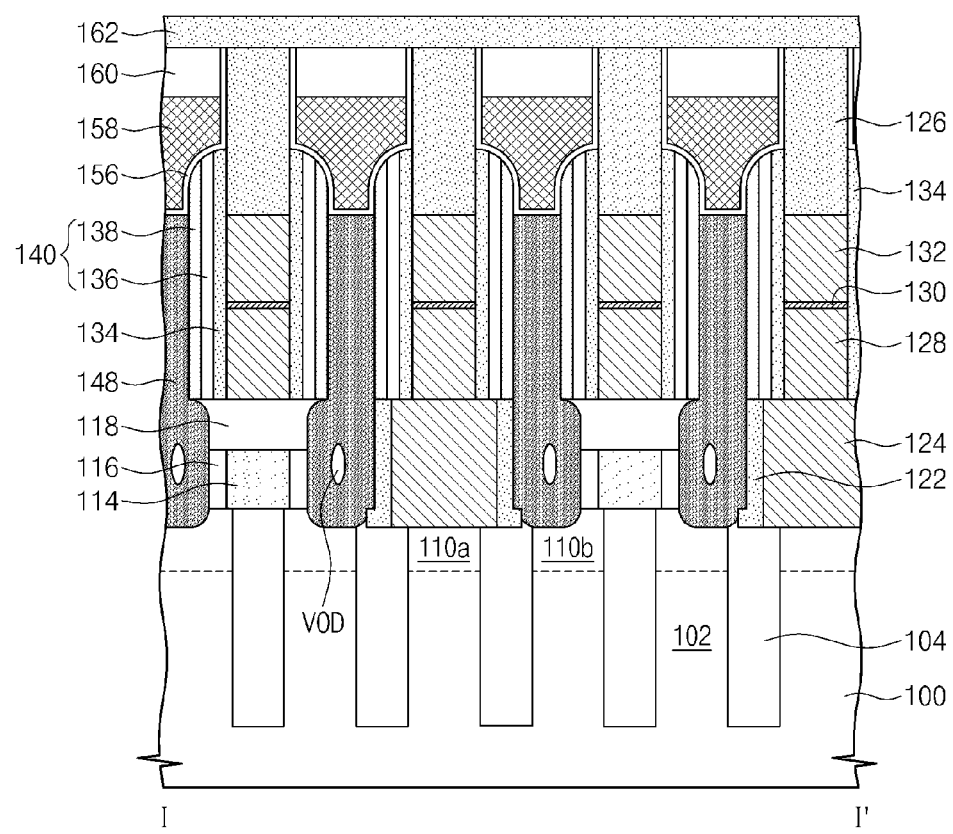
Figure 12C:
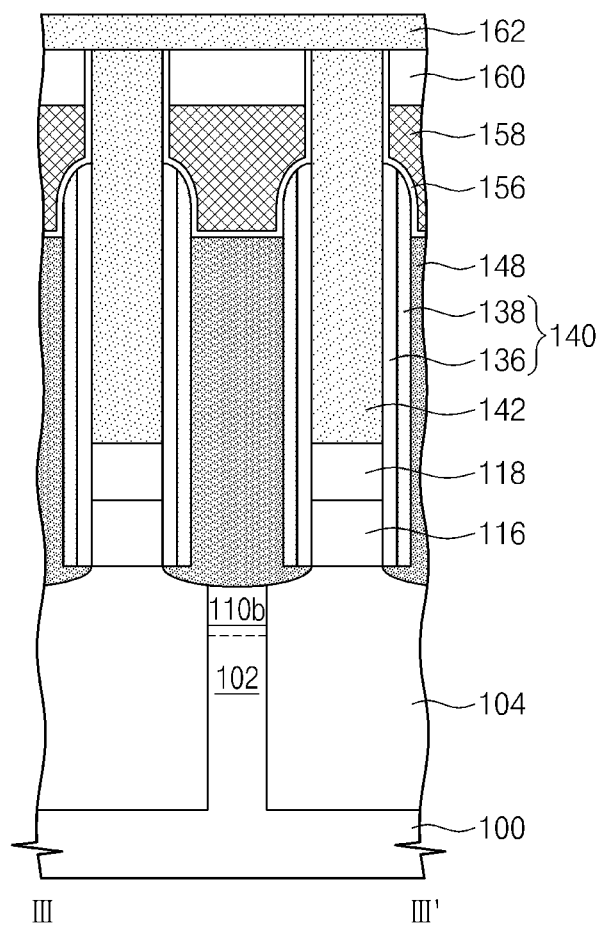

Referring to FIGS. 12A, 12B, and 12C, first sacrificial patterns 160 may be formed in the third contact holes 150, and a sixth insulating layer 162 may be formed to cover the first sacrificial patterns 160, the second capping patterns 126, and the second insulating fences 142.

For example, the formation of the first sacrificial patterns 160 may include forming a first sacrificial layer (not shown) to fill the upper regions of the third contact holes 150. The first sacrificial layer may include at least one of materials having an etch selectivity with respect to the second capping patterns 126 and the second insulating fences 142. The first sacrificial layer may be formed of or include at least one selected from the group consisting of silicon oxide, silicon nitride, silicon oxynitride, spin on hardmask (SOH) materials, and photoresist materials. Next, the first sacrificial layer may be etched to expose the top surfaces of the second capping patterns 126 and the second insulating fences 142, and thus, the first sacrificial patterns 160 may be formed in the third contact holes 150.

Thereafter, the sixth insulating layer 162 may be formed on the first sacrificial patterns 160, the second capping patterns 126, and the second insulating fences 142. The sixth insulating layer 162 may include at least one of materials having an etch selectivity with respect to the first sacrificial layer. The sixth insulating layer 162 may be formed of or include at least one of silicon oxide, silicon nitride, or silicon oxynitride.

Figure 13A:
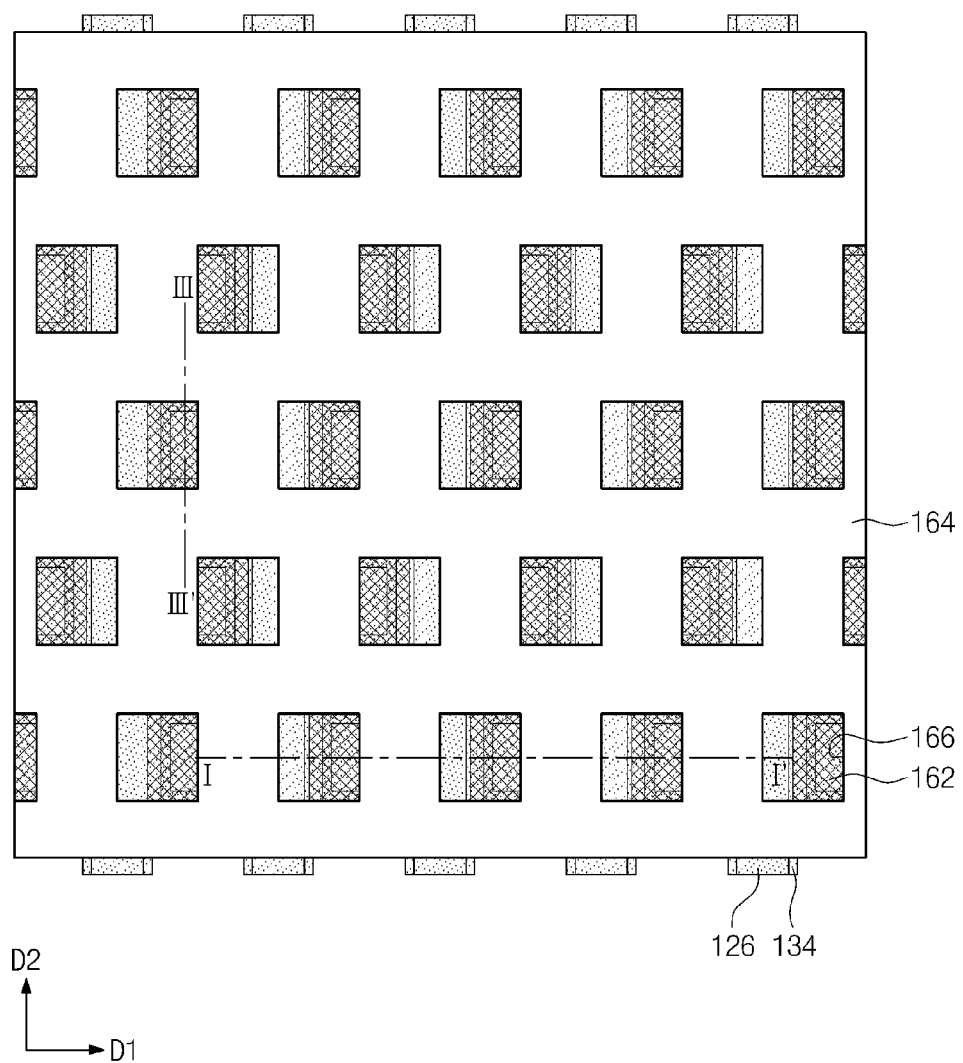
Figure 13B:
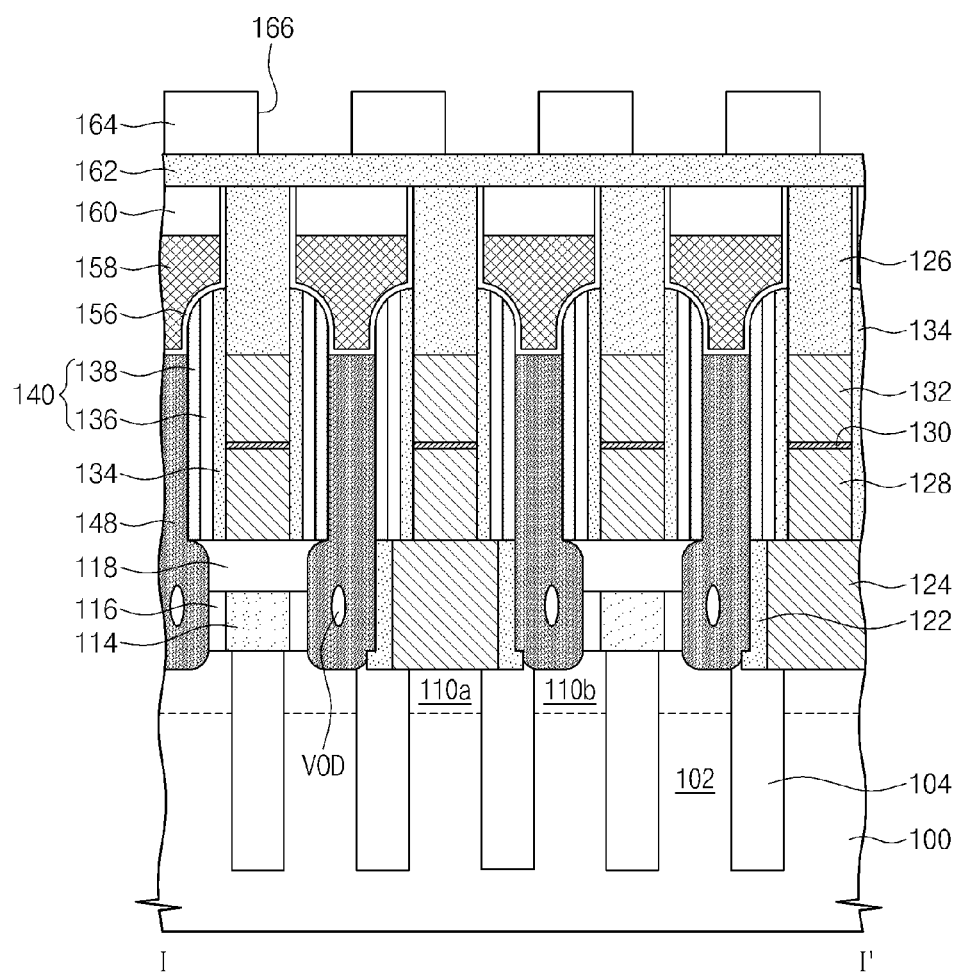
Figure 13C:
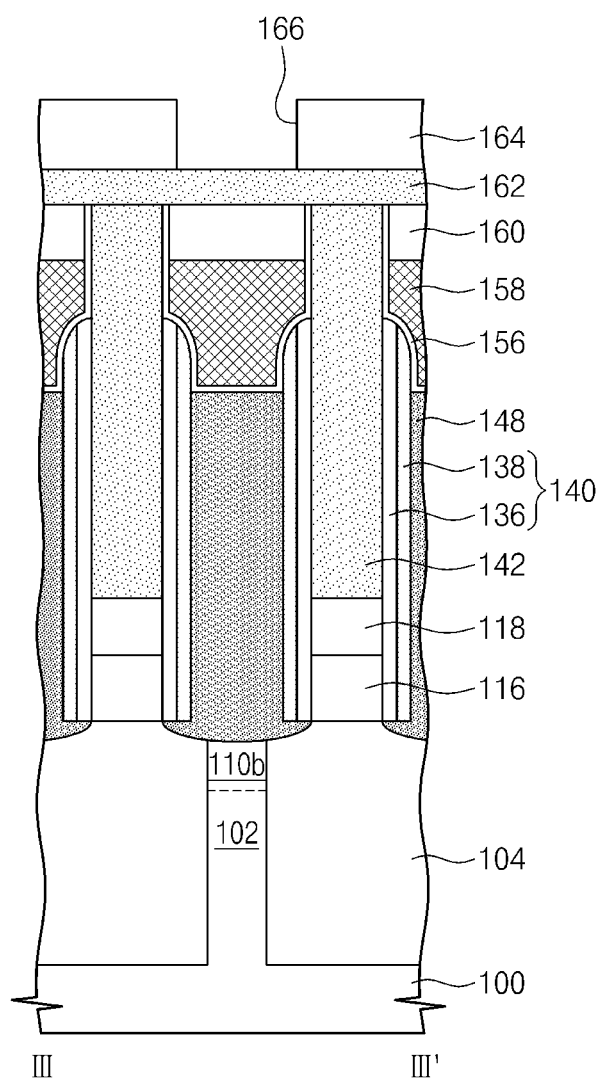

Referring to FIGS. 13A, 13B, and 13C, the mask pattern 164 may be formed on the sixth insulating layer 162. The mask pattern 164 may be formed to define openings 166, each of which is at least partially overlapped in a vertical direction with a corresponding one of the contact pads 158.

Figure 14A:
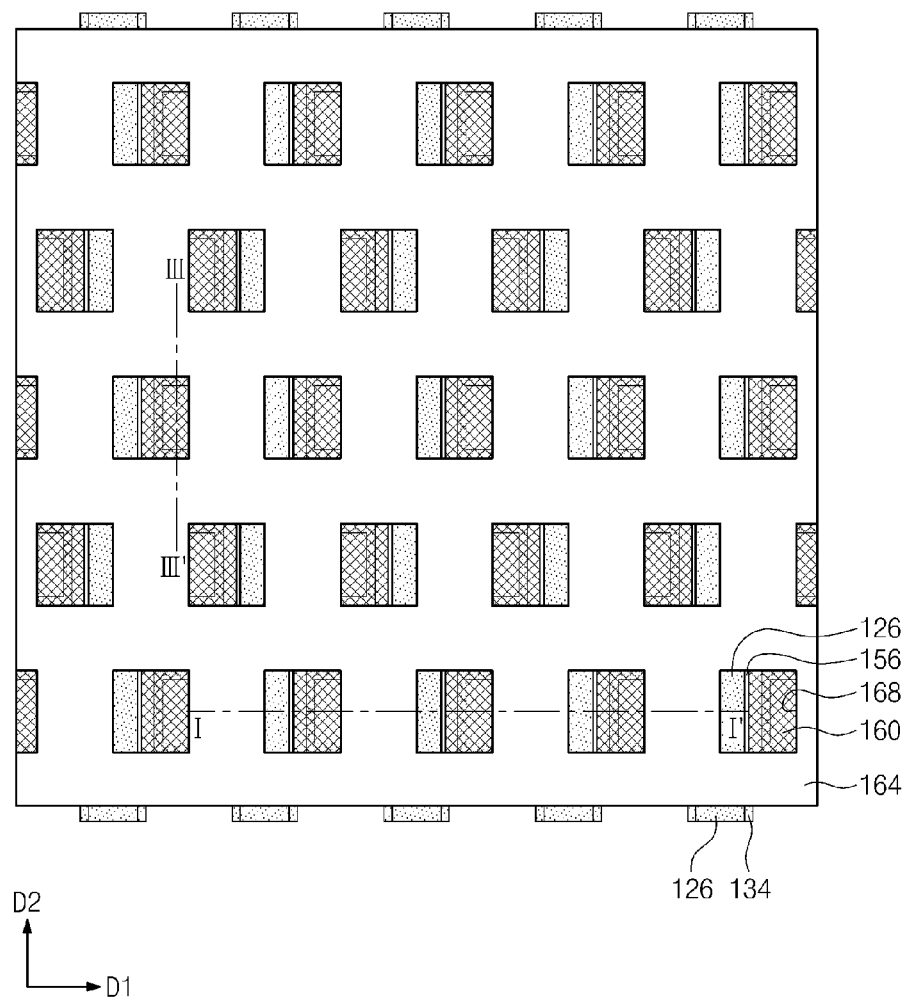
Figure 14B:
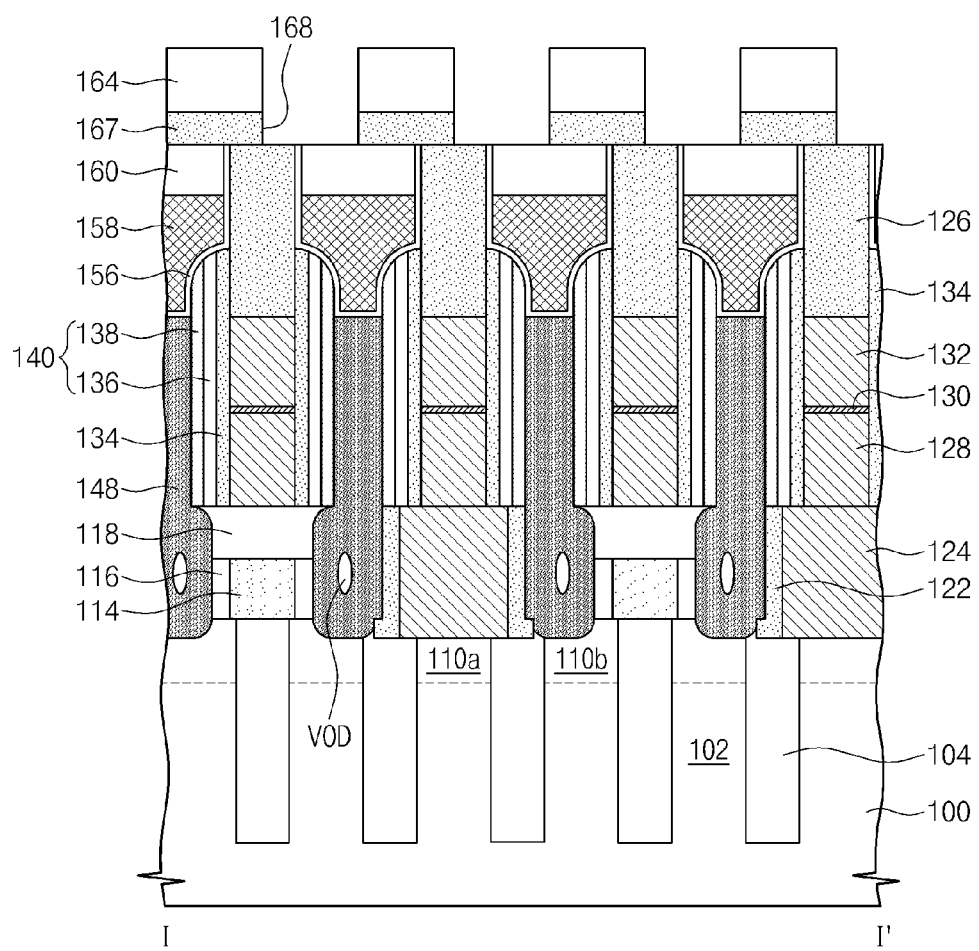
Figure 14C:
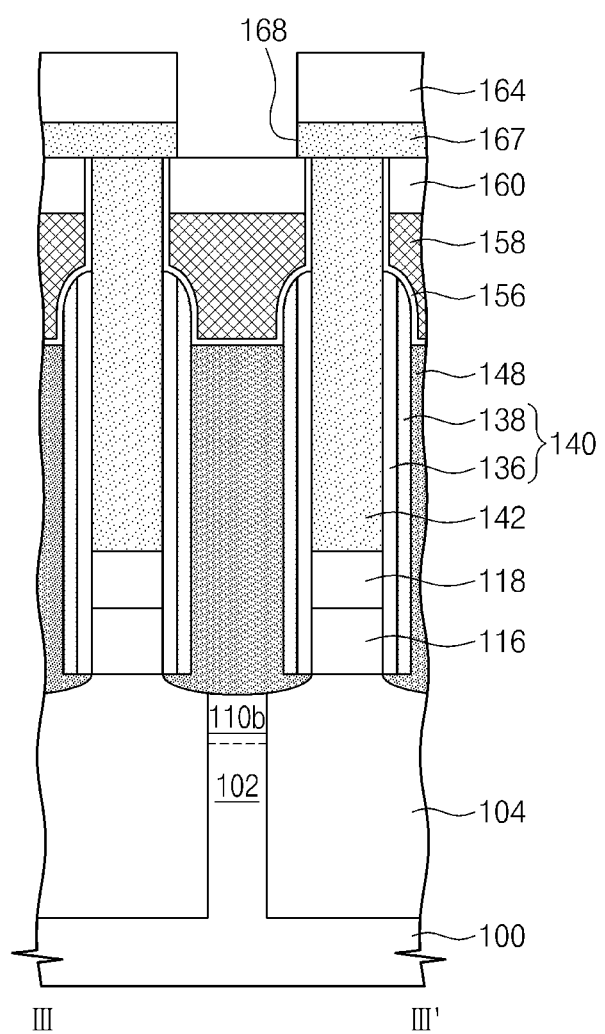

Referring to FIGS. 14A, 14B, and 14C, the sixth insulating layer 162 may be etched using the mask pattern 164 as an etch mask to form the additional insulating pattern 167. The additional insulating pattern 167 may be formed to have fourth contact holes 168, each of which is formed to at least partially expose an upper portion of at least one of the second capping patterns 126 and the second insulating fences 142.

Furthermore, the fourth contact holes 168 may be formed to at least partially expose the first sacrificial patterns 160, respectively.

Figure 15A:
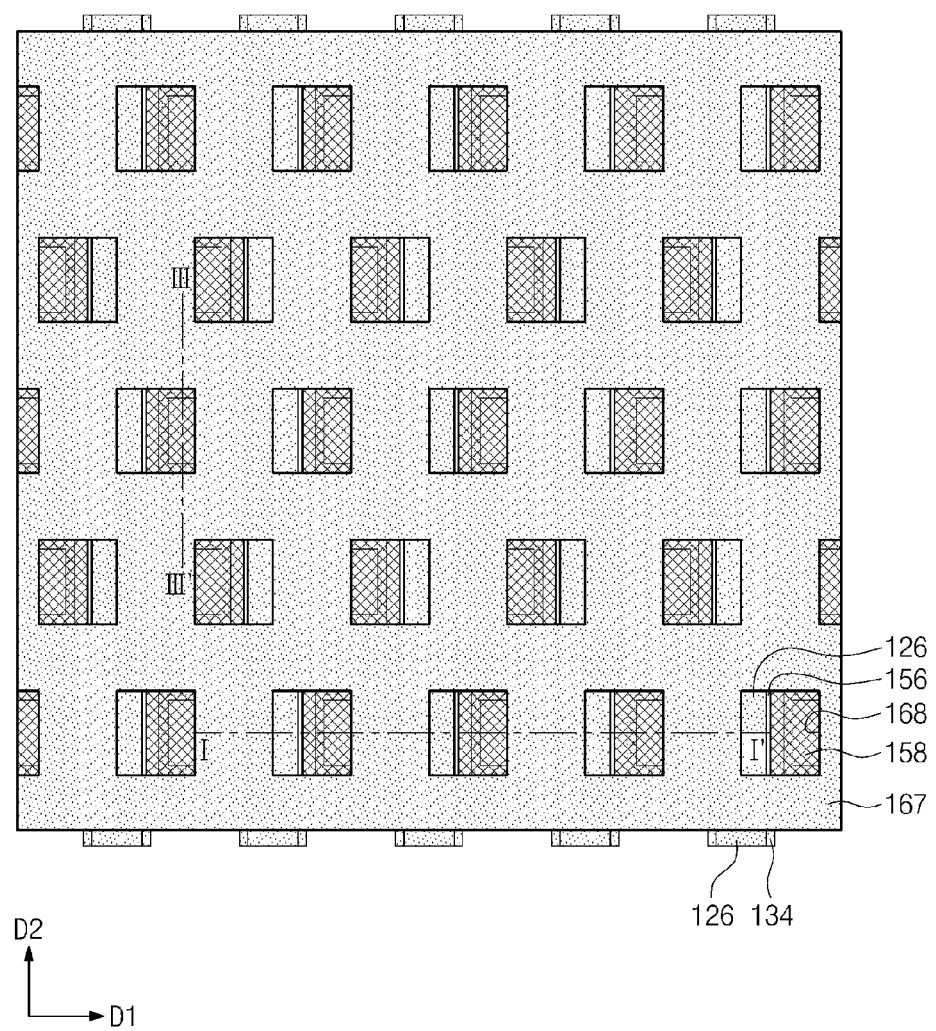
Figure 15B:
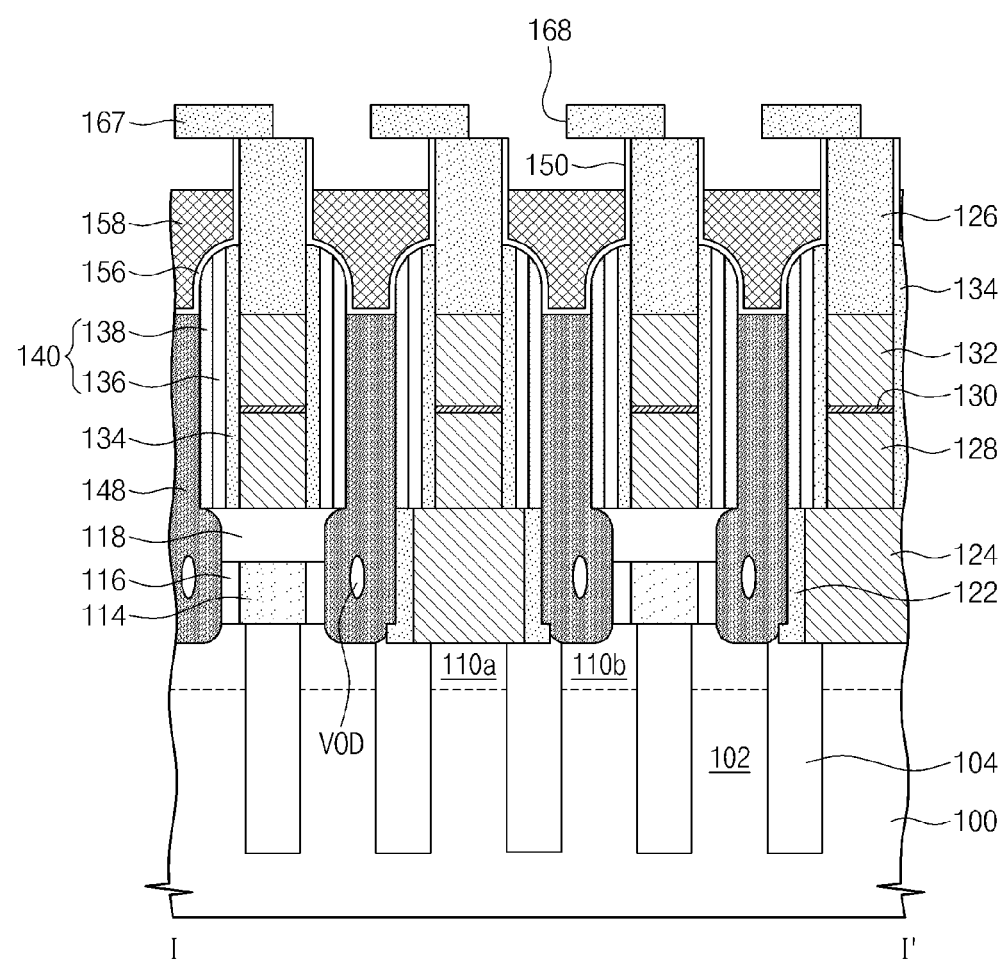
Figure 15C:
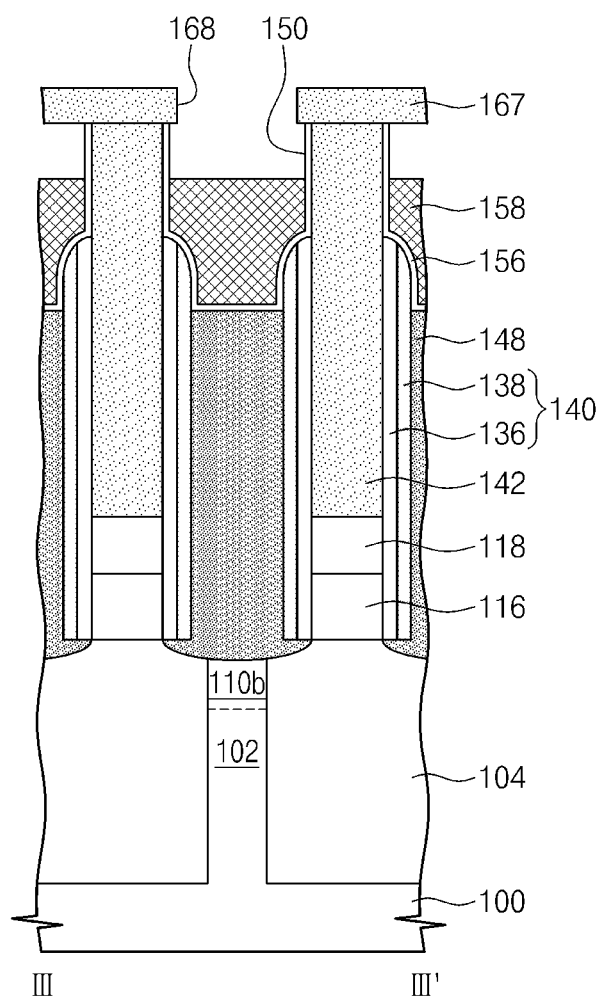

Referring to FIGS. 15A, 15B, and 15C, the first sacrificial patterns 160 may be removed to re-open the upper regions of the third contact holes 150. In some embodiments, an isotropic etching process or a wet etching process may be used to remove the first sacrificial patterns 160.

As shown, the fourth contact holes 168 may be connected to the third contact holes 150, respectively. In addition, the fourth contact holes 168 may be formed to have centers that are laterally shifted from centers of the third contact holes 150.

The mask pattern 164 may be removed. In example embodiments, the mask pattern 164 may be removed using the process of removing the first sacrificial patterns 160. In example embodiments, any suitable process, other than the process for removing the first sacrificial patterns 160, may be performed to remove the mask pattern 164, after the formation of the additional insulating pattern 167.

Figure 16A:
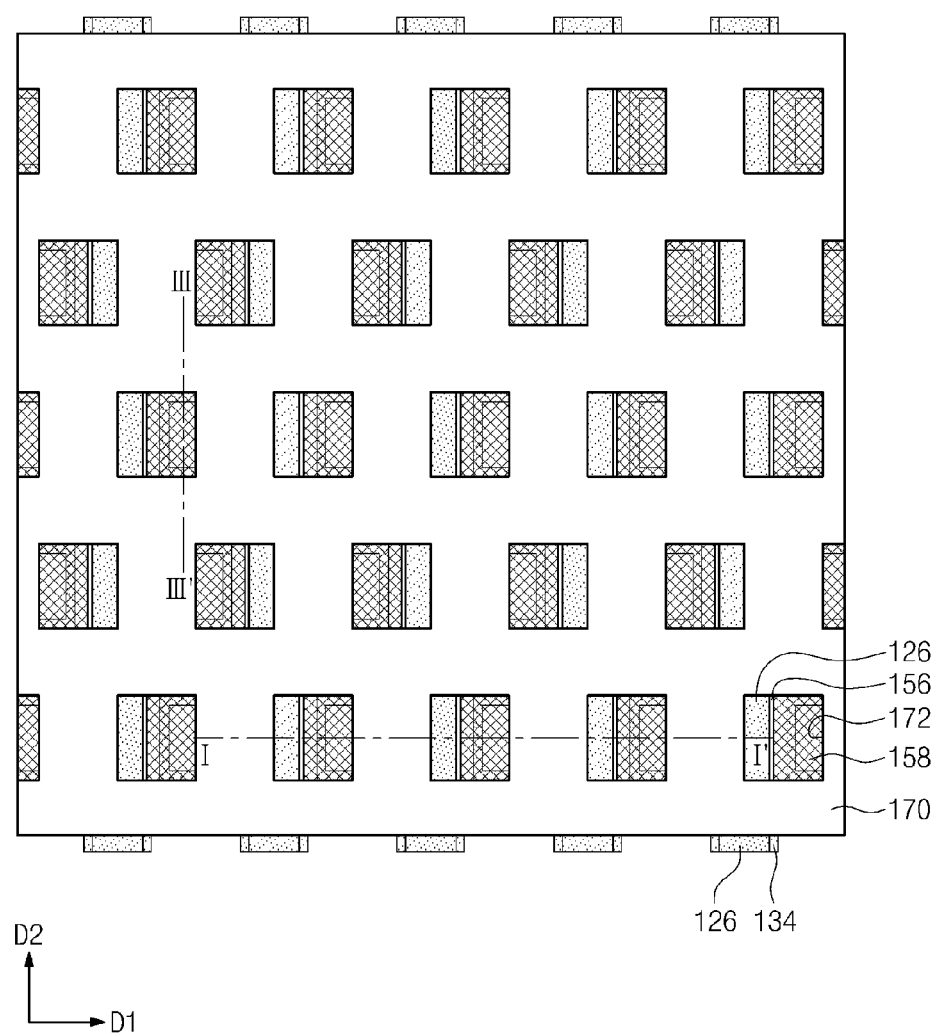
Figure 16B:
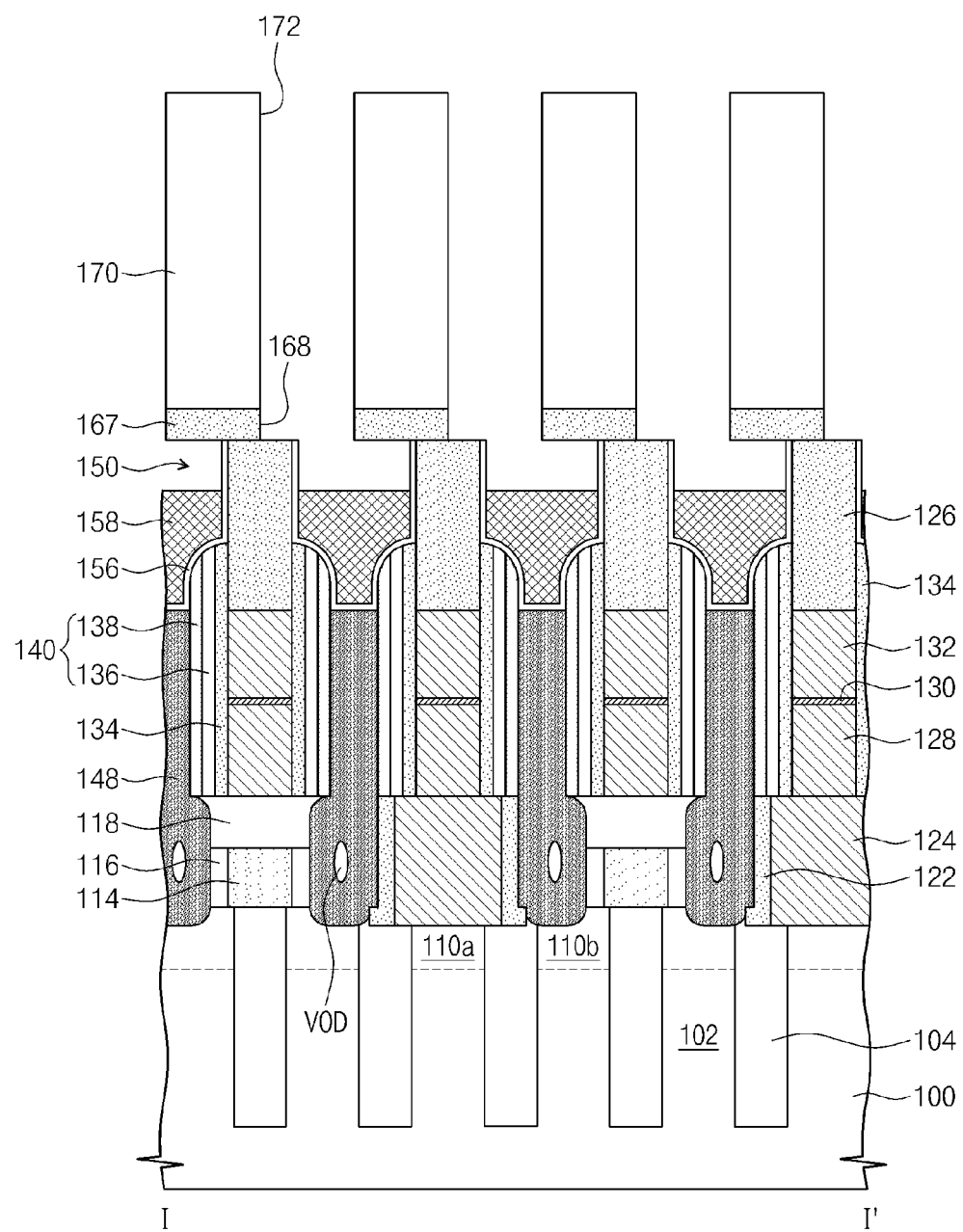
Figure 16C:
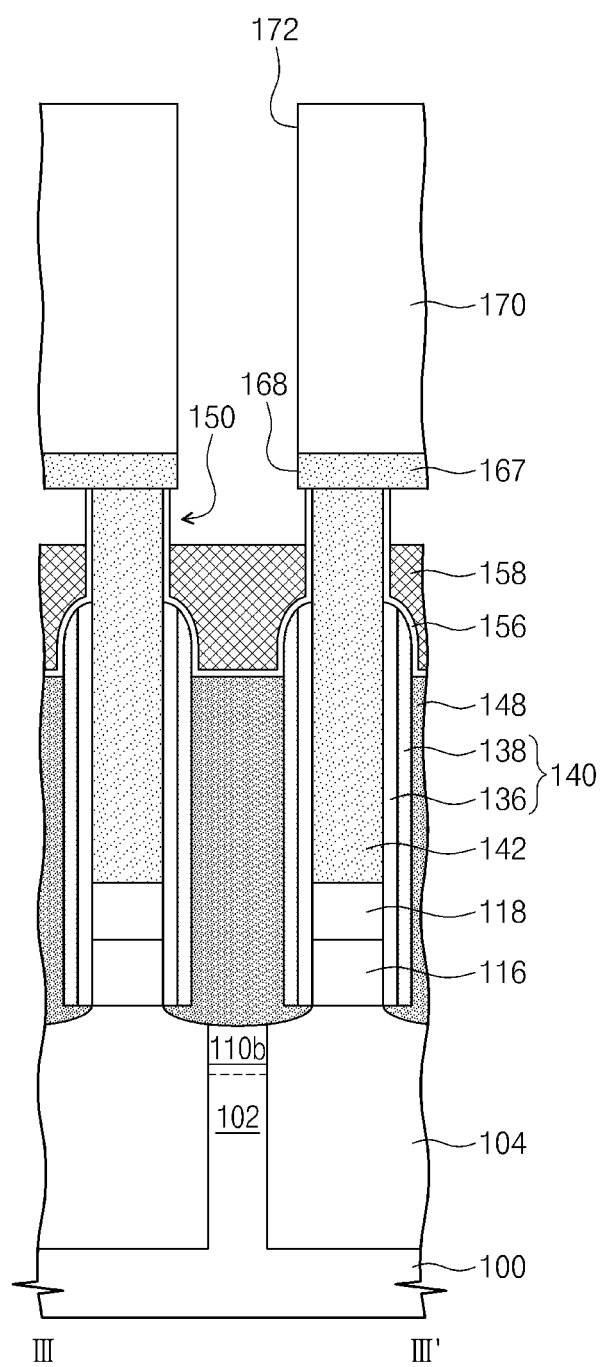

Referring to FIGS. 16A, 16B, and 16C, a second sacrificial pattern 170 may be formed on the additional insulating pattern 167.

For example, a second sacrificial layer (not shown) may be formed on the additional insulating pattern 167 and may be patterned to form the second sacrificial pattern 170 having storage holes 172. For example, the storage holes 172 may be connected to the fourth contact holes 168, respectively. In example embodiments, a width of the respective storage holes 172 and a width of the respective fourth contact holes 168 in the first direction may be equal. The second sacrificial layer may include at least one of materials having an etch selectivity with respect to the additional insulating pattern 167, the second capping patterns 126, the second insulating fences 142, and the contact pads 158. The second sacrificial layer may be formed of or include at least one selected from the group consisting of silicon oxide, silicon nitride, silicon oxynitride, spin on hardmask (SOH) materials, and photoresist materials.

Figure 17A:
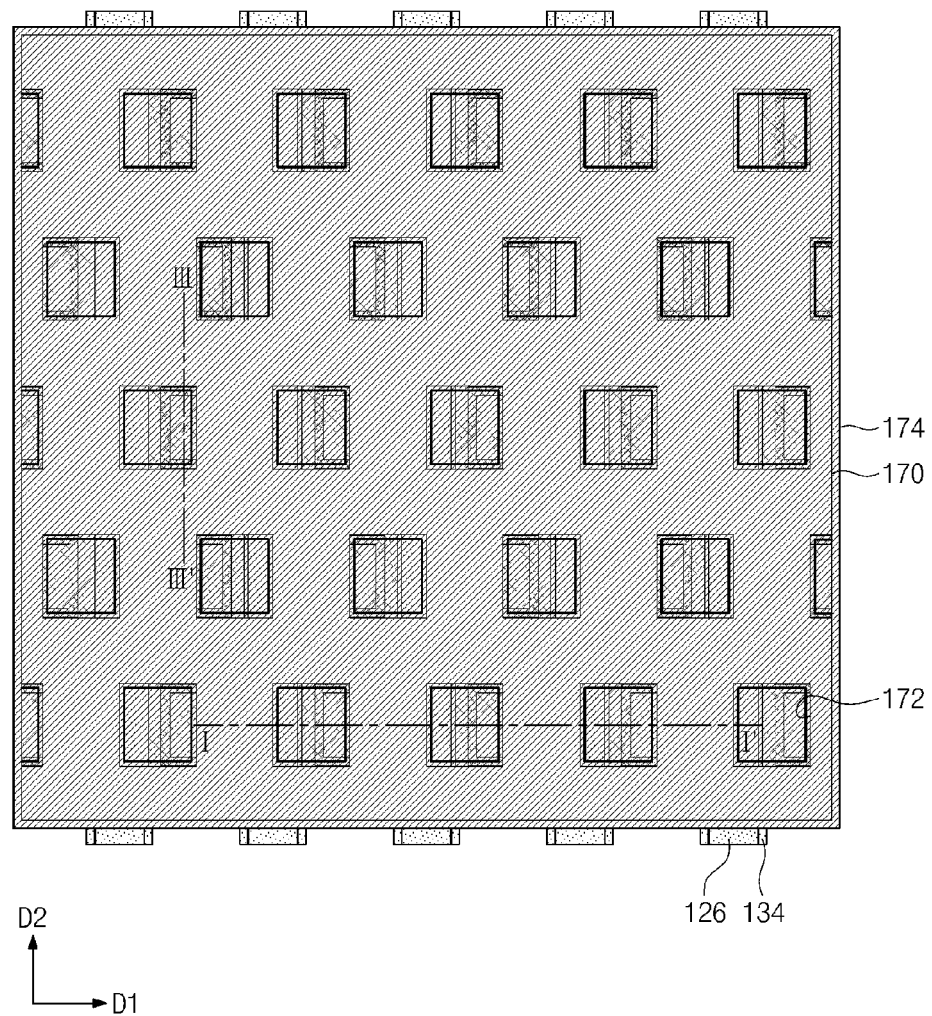
Figure 17B:
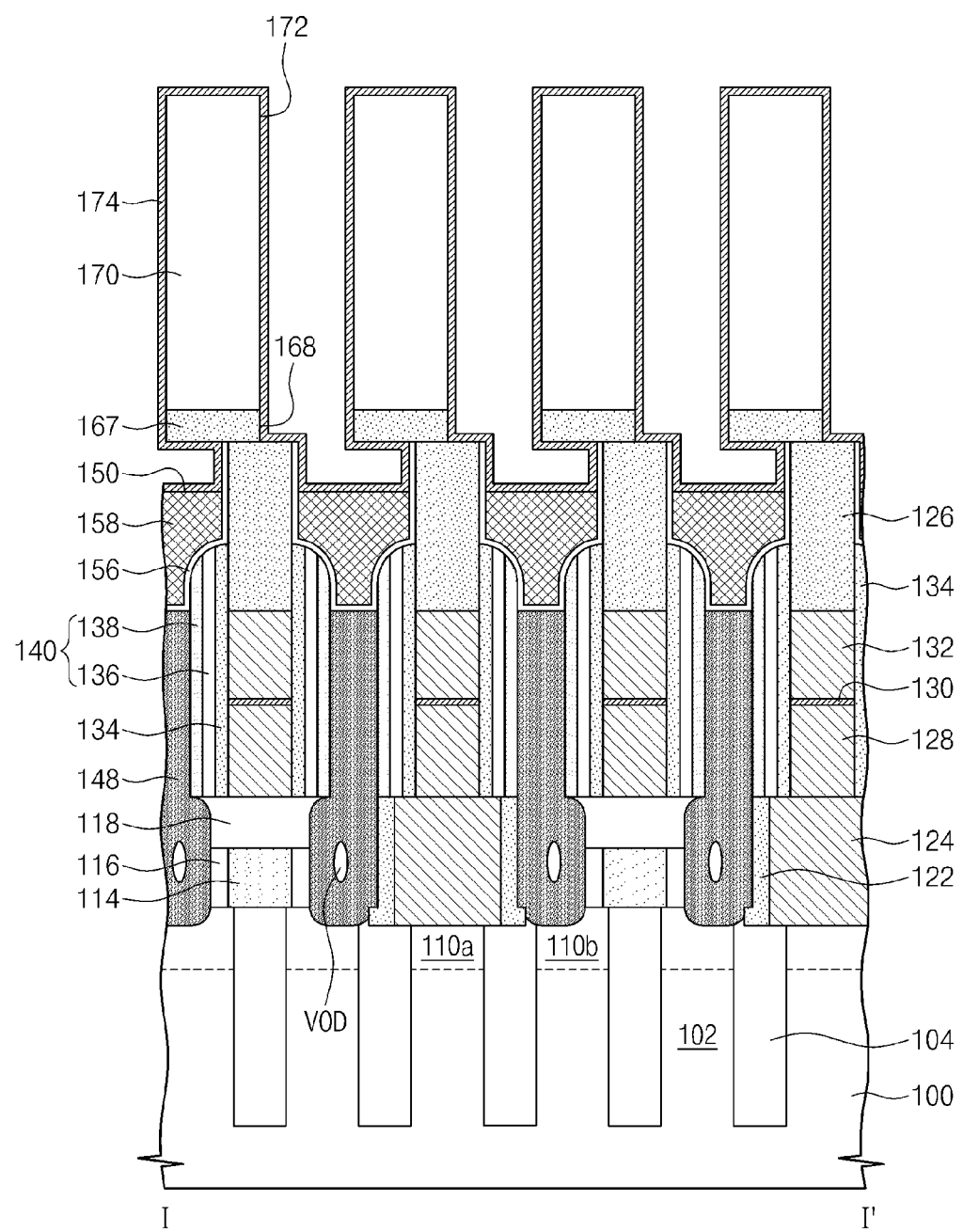
Figure 17C:
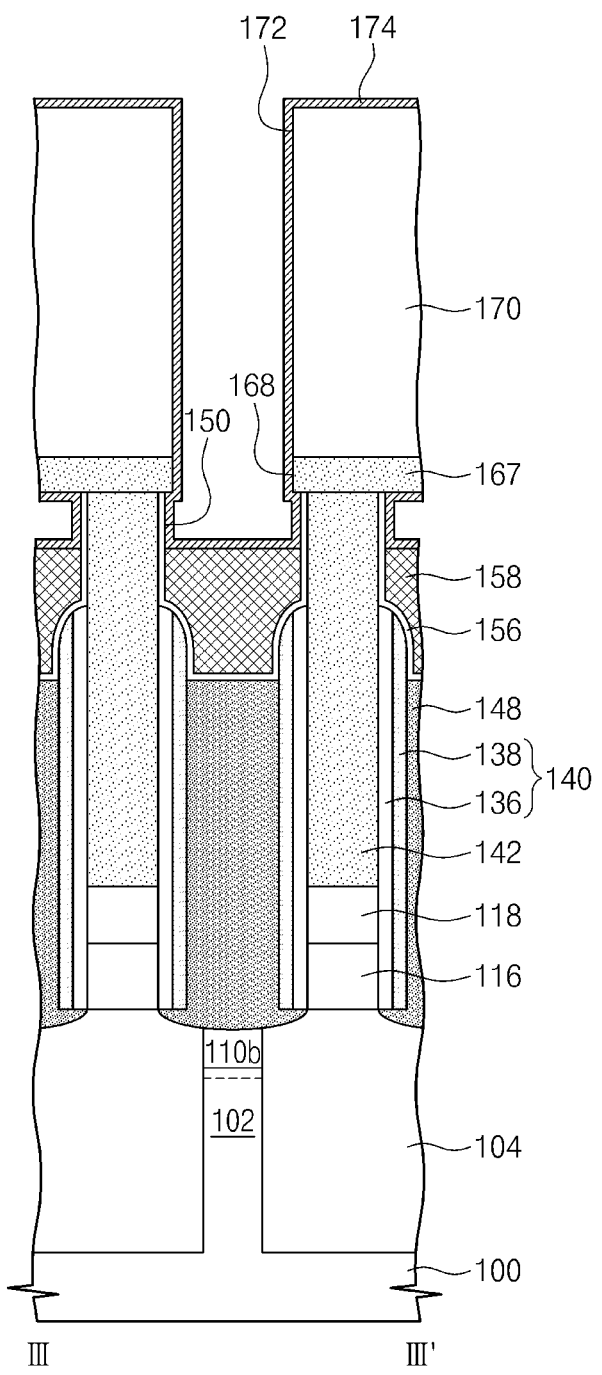

Referring to FIGS. 17A, 17B, and 17C, a bottom electrode layer 174 may be formed to conformally cover the second sacrificial pattern 170, the additional insulating pattern 167, the second capping patterns 126, the second insulating fences 142, and the contact pads 158. The bottom electrode layer 174 may be formed in one-step process to connect the contact pads 158. The bottom electrode layer 174 may be formed to prevent the storage holes 172 of the second sacrificial pattern 170 and the third and fourth contact holes 150 and 168 from being completely filled therewith.

The bottom electrode layer 174 may be formed by an atomic layer deposition (ALD) process or a chemical vapor deposition (CVD) process.

The bottom electrode layer 174 may include doped silicon, metals (e.g., tungsten or copper), or metal compounds (e.g., titanium nitride).

Figure 18A:
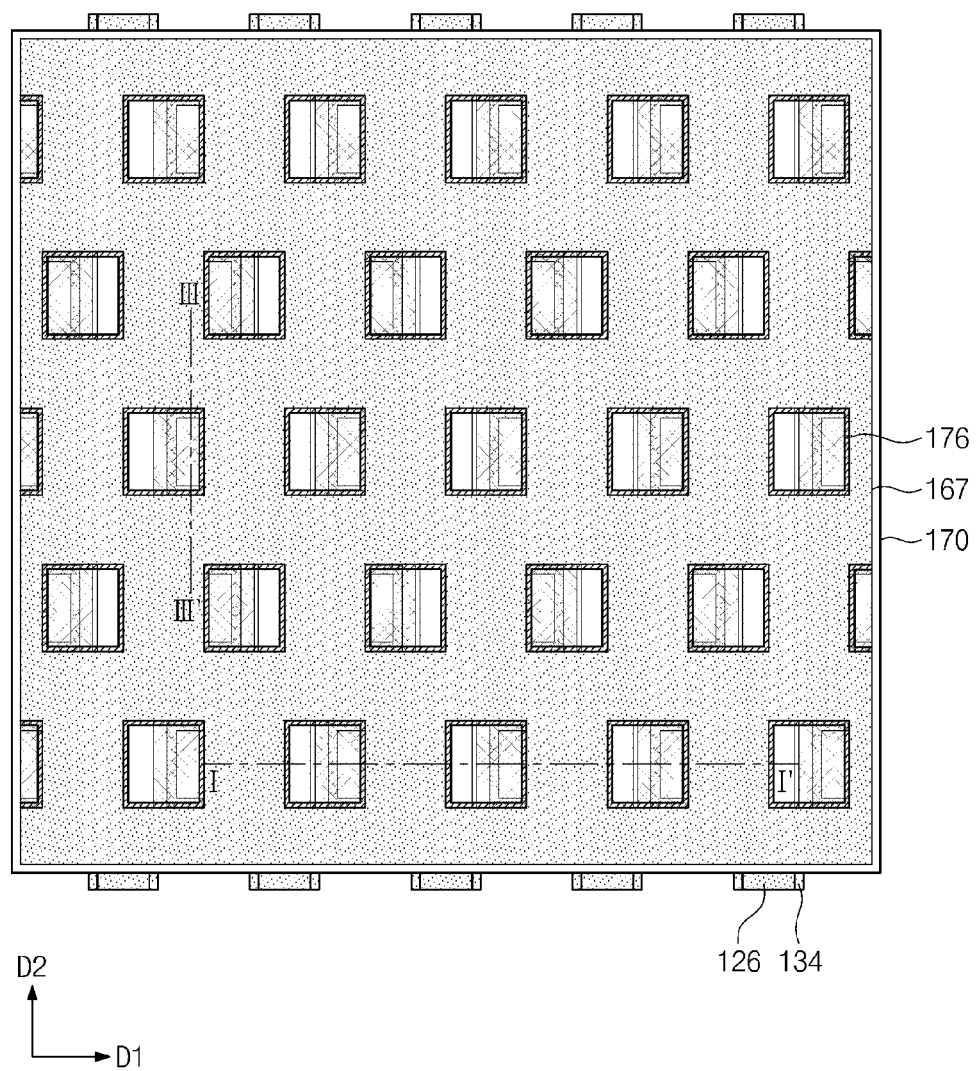
Figure 18B:
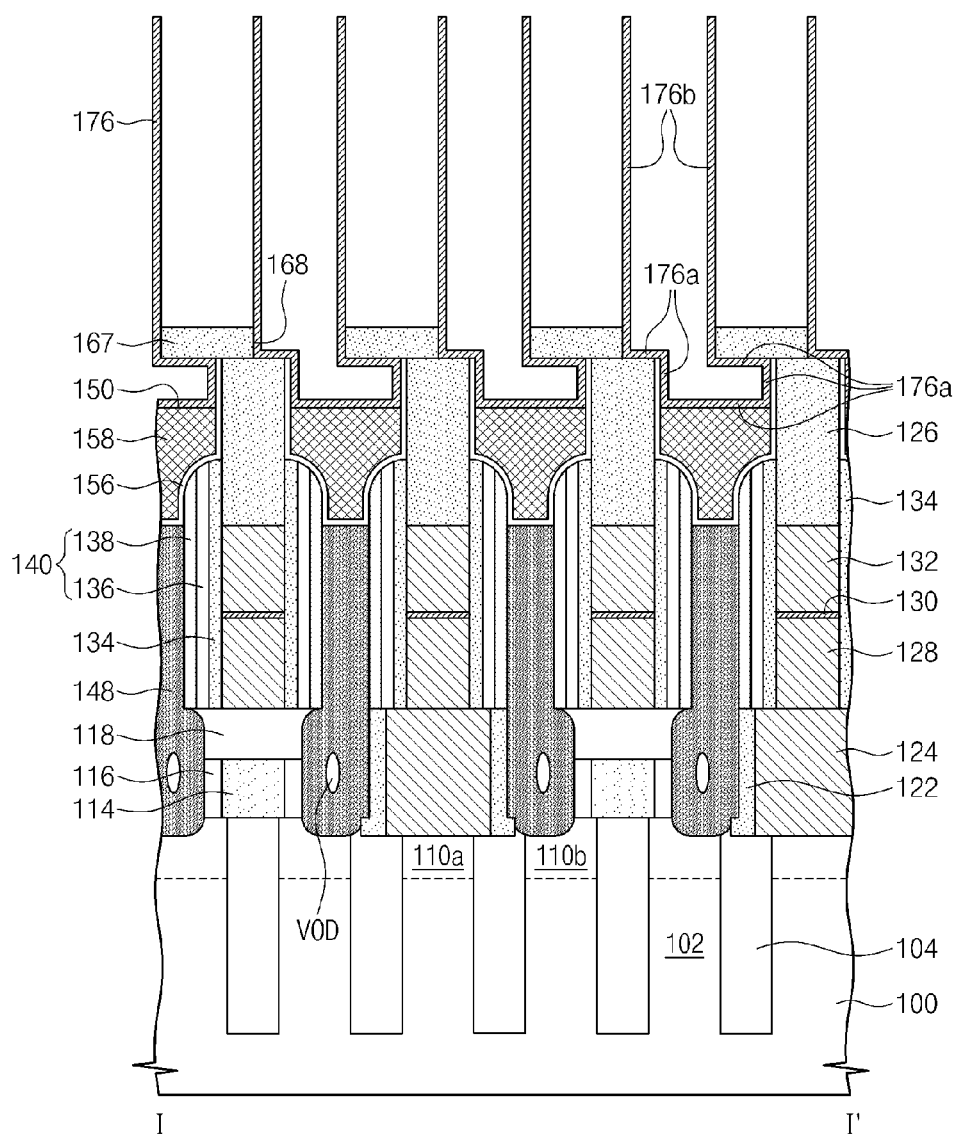
Figure 18C:
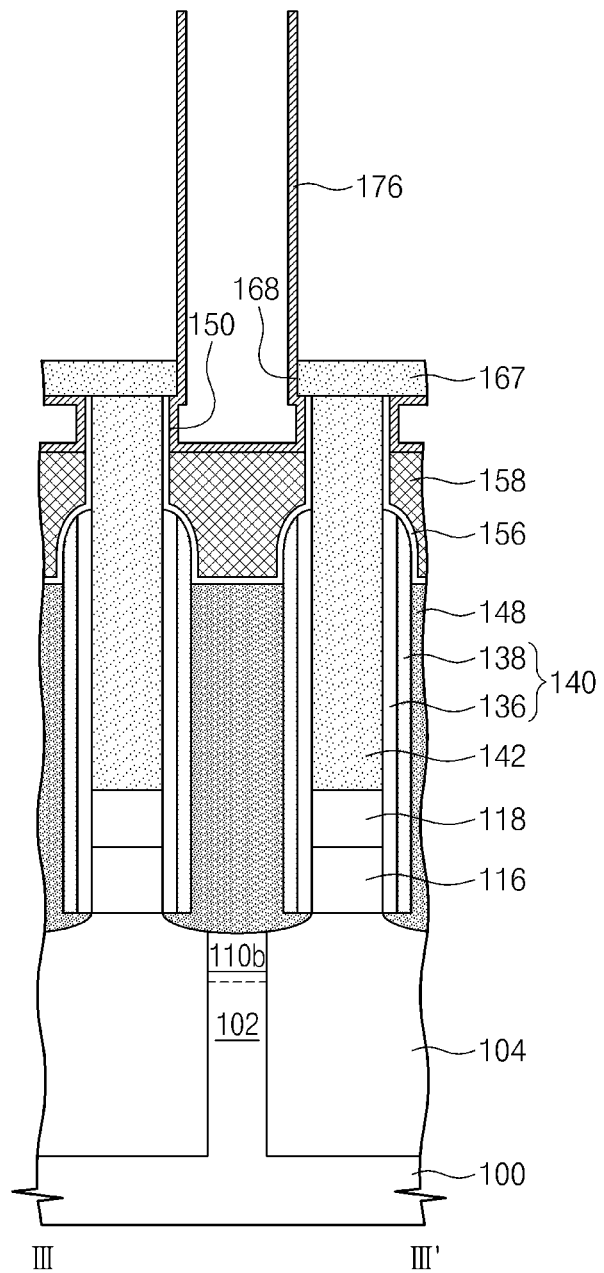

Referring to FIGS. 18A, 18B, and 18C, the bottom electrode layer 174 may be etched to form the bottom electrodes 176.

For example, a third sacrificial layer (not shown) may be formed to completely fill the storage holes 172 and the third and fourth contact holes 150 and 168. The third sacrificial layer may be formed of or include a material, which is substantially the same as the second sacrificial layer and has an etch selectivity with respect to the additional insulating pattern 167, the second capping patterns 126, the second insulating fences 142, and the contact pads 158. For example, the third sacrificial layer may be formed of or include at least one selected from the group consisting of silicon oxide, silicon nitride, silicon oxynitride, spin on hardmask (SOH) materials, and photoresist materials.

Thereafter, an etch-back process may be performed on the third sacrificial layer to expose the top surface of the bottom electrode layer 174, and thus, third sacrificial patterns (not shown) may be formed. The bottom electrode layer 174 may be etched to expose the top surface of the second sacrificial pattern 170, and thus, the bottom electrodes 176 may be formed.

The second sacrificial pattern 170 and the third sacrificial patterns may be removed, after the formation of the bottom electrodes 176.

In example embodiments, the bottom electrodes 176 may include the lower portions 176a connected to top surfaces of the contact pads 158 and sidewalls of the third contact holes 150, and the upper portions 176b connected to sidewalls of the fourth contact holes 168 and the storage holes 172. In some embodiments, a center of each of the second portions 176b may be shifted from a center of each of the first portions 176a.

Figure 19A:
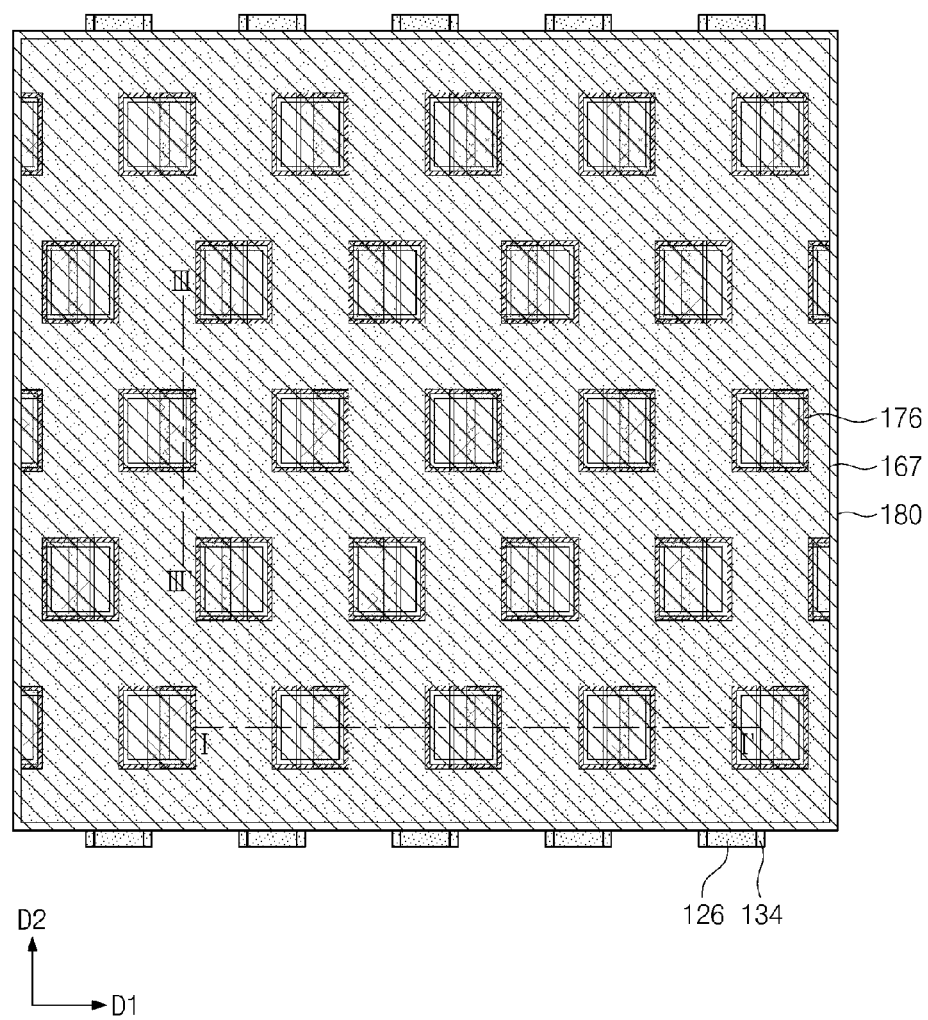
Figure 19B:
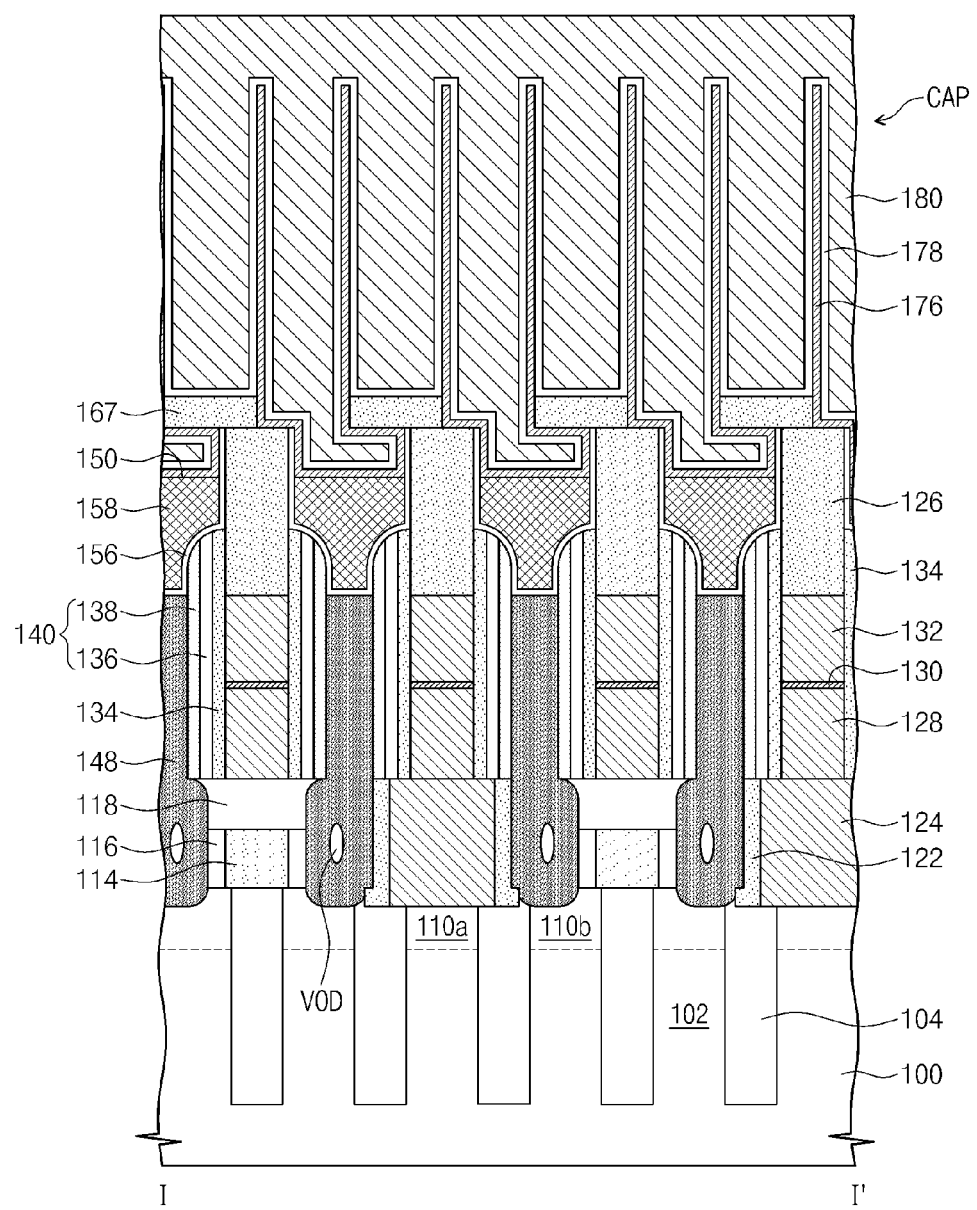
Figure 19C:
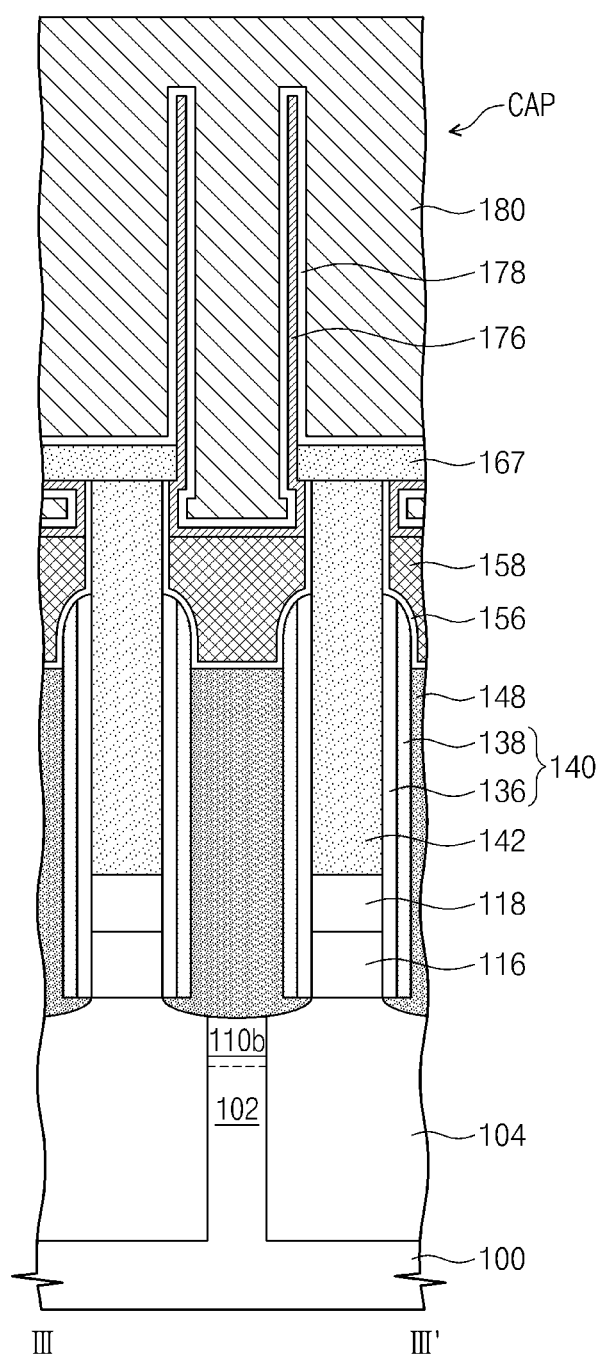

Referring to FIGS. 19A, 19B, and 19C, the dielectric layer 178 may be formed to conformally cover outer and inner sidewalls of the bottom electrodes 176, and the top electrode 180 may be formed to fill empty spaces in and between the bottom electrodes 176.

According to example embodiments of the present disclosure, a semiconductor device may include a transistor and a capacitor, which are connected to each other through a contact plug and a contact pad. For example, an etch-back process may be performed to form the contact pad in a self-aligned manner with respect to the contact plug, and this may make it possible to omit an additional photolithography process.

While example embodiments have been particularly shown and described, it will be understood by one of ordinary skill in the art that variations in form and detail may be made therein without departing from the spirit and scope of the attached claims.

What is claimed is:

1. A method for manufacturing a semiconductor device, the method comprising:
   providing a substrate;
   forming first insulating patterns on the substrate;
   forming first holes above the substrate, the first holes spaced apart from each other in a first direction, the first holes disposed between the first insulating patterns;
   forming contact pads between the first insulating patterns and filling first portions of the first holes;
   forming first sacrificial patterns on the contact pads to fill second portions of the first holes above the first portions of the first holes, the first sacrificial patterns contacting the contact pads;
   forming second insulating patterns on the first insulating patterns;
   forming second holes between the second insulating patterns to partially expose the respective first sacrificial patterns;
   removing the first sacrificial patterns to connect the first holes and the second holes; and
   forming a bottom electrode layer having a first portion contacting top surfaces of the contact pads and contacting sidewalls of the second portions of the first holes.

2. The method of claim 1, further comprising:
   forming contact plugs filling third portions of the first holes below the first portions of the first holes,
   wherein the contact pads and the corresponding contact plugs are connected to each other.

3. The method of claim 2, further comprising:
   forming source regions and drain regions of transistors; and
   forming bit lines between the contact plugs,
   wherein, in forming the contact plugs, the contact plugs are electrically connected to the respective source regions, and
   wherein, in forming the bit lines, the bit lines are electrically connected to the respective drain regions.

4. The method of claim 2, wherein, in forming the contact pads and forming the contact plugs, the contact pads and the contact plugs are formed to be self-aligned with each other.

5. The method of claim 1, further comprising:
   forming second sacrificial patterns on the second insulating patterns; and
   forming third holes between the second sacrificial patterns and connected to the second holes,
   wherein the bottom electrode layer further includes a second portion upwardly straightly extending along inner sidewalls of the third holes.

6. The method of claim 5, wherein, in forming the first to third holes, a center of each of the second and third holes is shifted in the first direction from a center of each of the first holes.

7. The method of claim 1, wherein, in forming the contact pads, each of the contact pads includes a first portion having a first width in the first direction and a second portion under the first portion, the second portion having a second width in the first direction smaller than the first width of the first portion.

8. The method of claim 1, wherein, in forming the first holes, for each of the first holes, the first hole includes a first portion having a first width in the first direction, a second portion above the first portion of the first hole having a second width smaller than the first width, and a third portion of the first hole above the second portion of the first hole having a third width greater than the second width.

9. The method of claim 1, wherein the first sacrificial patterns includes at least one of silicon oxide, silicon nitride, silicon oxynitride, spin on hardmask (SOH) materials, or photoresist materials.

10. A method for manufacturing a semiconductor device, the method comprising:
    forming first holes on a substrate between first insulating patterns spaced apart from each other in a first direction, each of the first holes including first, second, and third regions from a bottom to a top of the respective first holes;

forming first contact plugs filling the first regions of the first holes and lower portions of the second regions of the first holes;

forming second contact plugs on the first contact plugs and filling upper portions of the second regions of the first holes and lower portions of the third regions of the first holes;

forming first sacrificial patterns on the second contact plugs and filling upper portions of the third regions of the first holes;

forming second holes to partially expose the respective first sacrificial patterns;

removing the first sacrificial patterns to connect the third regions of the first holes with the second holes; and forming a bottom electrode layer connected to the respective second contact plugs, wherein, for each of the first holes, a first width of the first region in the first direction is greater than a second width of the second region in the first direction, and a third width of the third region in the first direction is greater than the second width of the second region.

11. The method of claim 10, further comprising:
forming barrier patterns between the first and second contact plugs.

12. The method of claim 10, wherein, in forming the first and second contact plugs, the first and second contact plugs are formed to be self-aligned with each other.

13. The method of claim 10, wherein, in forming the second holes, a center of each of the second holes is shifted from a center of each of the first holes.

14. The method of claim 10, wherein, in forming the second holes, the second holes are formed between second insulating patterns partially overlapping with the first insulating patterns in a second direction perpendicular to the first direction.

15. The method of claim 14, wherein, further comprising:
forming second sacrificial patterns on the second insulating patterns; and
forming third holes between the second sacrificial patterns and connected to the second holes, wherein the bottom electrode layer further includes a second portion upwardly straightly extending along inner sidewalls of the third holes.

16. A method for manufacturing a semiconductor device, the method comprising:
forming first insulating patterns on a substrate;
forming first holes between the first insulating patterns, the first holes being spaced apart from each other in a first direction;
after forming the first holes, forming contact pads between the first insulating patterns to fill lower portions of the first holes;
after forming the contact pads, forming second holes between second insulating patterns, the second holes vertically overlapping with only partial portions of the first holes; and
forming a bottom electrode layer including first portions to cover top surfaces of the contact pads and sidewalls of the first holes.

17. The method of claim 16, wherein, in forming the first holes, the first holes are formed by an isotropic etching process or a wet etching process.

18. The method of claim 16, further comprising:
forming first sacrificial patterns on the second insulating patterns; and
forming third holes between the first sacrificial patterns and connected to the second holes,
wherein, in forming the bottom electrode layer, the bottom electrode layer further includes second portions upwardly straightly extending along sidewalls of the second and third holes, and
wherein the bottom electrode layer is filled in only a partial portion of a corresponding one of the first holes.

19. The method of claim 18, wherein, in forming the contact pads and the bottom electrode layer, a center of each of the first portions of the bottom electrode layer and a center of each of the contact pads are aligned with each other, and
wherein, in forming the second and third holes, a center of each of the second and third holes is aligned with each other.

20. The method of claim 18, wherein, in forming the first and second holes, a center of each of the second holes is shifted from a center of each of the first holes.

* * * * *